(12) United States Patent
Watanabe et al.

(10) Patent No.: US 10,580,501 B2
(45) Date of Patent: Mar. 3, 2020

(54) SEMICONDUCTOR MEMORY DEVICE

(71) Applicant: TOSHIBA MEMORY CORPORATION, Tokyo (JP)

(72) Inventors: Toshifumi Watanabe, Yokohama Kanagawa (JP); Naofumi Abiko, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/113,470

(22) Filed: Aug. 27, 2018

(65) Prior Publication Data
US 2019/0348131 A1   Nov. 14, 2019

(30) Foreign Application Priority Data

May 14, 2018 (JP) ................. 2018-092889

(51) Int. Cl.
| | |
|---|---|
| G11C 16/26 | (2006.01) |
| H01L 27/11582 | (2017.01) |
| H01L 27/1157 | (2017.01) |
| H01L 27/11573 | (2017.01) |
| G11C 16/34 | (2006.01) |
| G11C 16/08 | (2006.01) |
| G11C 16/24 | (2006.01) |
| G11C 16/32 | (2006.01) |
| G11C 16/10 | (2006.01) |

(52) U.S. Cl.
CPC .............. *G11C 16/26* (2013.01); *G11C 16/08* (2013.01); *G11C 16/10* (2013.01); *G11C 16/24* (2013.01); *G11C 16/32* (2013.01); *G11C 16/3459* (2013.01); *H01L 27/1157* (2013.01); *H01L 27/11573* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 6,643,188 B2 | 11/2003 | Tanaka et al. | |
| 7,064,980 B2 * | 6/2006 | Cernea ................ | G11C 11/5628 365/185.11 |
| 7,158,421 B2 | 1/2007 | Li et al. | |
| 8,315,104 B2 | 11/2012 | Futatsuyama et al. | |
| 8,503,232 B2 * | 8/2013 | Yang .................. | G11C 11/5628 365/185.03 |
| 8,699,273 B2 * | 4/2014 | Binboga ................ | G11C 16/10 365/185.19 |
| 9,437,302 B2 | 9/2016 | Tseng et al. | |

(Continued)

FOREIGN PATENT DOCUMENTS

| | | |
|---|---|---|
| JP | 2003196988 A | 7/2003 |
| JP | 2014225310 A | 12/2014 |

*Primary Examiner* — Tan T. Nguyen
(74) *Attorney, Agent, or Firm* — Kim & Stewart LLP

(57) ABSTRACT

According to one embodiment, a semiconductor memory device includes a memory cell array having a plurality of memory cells, a plurality of bit lines, each bit line being connected to one of the memory cells in the plurality of memory cells, and a word line commonly connected to the plurality of memory cells. A control circuit is configured to apply a program voltage to the word line and to change a voltage applied to a first bit line in the plurality of bit lines within a first period in which the program voltage is being applied to the word line.

20 Claims, 21 Drawing Sheets

(56) References Cited

U.S. PATENT DOCUMENTS

| | | | |
|---|---|---|---|
| 9,502,130 B2 | 11/2016 | Harada et al. | |
| 9,672,926 B2 | 6/2017 | Shiino et al. | |
| 2014/0269056 A1* | 9/2014 | Chang | G11C 16/10 365/185.03 |
| 2015/0287466 A1* | 10/2015 | Kim | G11C 11/5628 711/103 |
| 2015/0332771 A1* | 11/2015 | Kwon | G11C 16/10 365/185.11 |

* cited by examiner

FIG. 11

(1) DATA-IN

|  | STATE | | | | | | | |
|---|---|---|---|---|---|---|---|---|
|  | Er | A | B | C | D | E | F | G |
| XDL | 1 | 1 | 1 | 0 | 0 | 0 | 0 | 1 |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| SDL | x | x | x | x | x | x | x | x |
| TDL | x | x | x | x | x | x | x | x |
| SEN | x | x | x | x | x | x | x | x |

FIG. 12

(2) TDL=ADL&BDL&CDL

|  | STATE | | | | | | | |
|---|---|---|---|---|---|---|---|---|
|  | Er | A | B | C | D | E | F | G |
| XDL | 1 | 1 | 1 | 0 | 0 | 0 | 0 | 1 |
| ADL | 1 | 0 | 0 | 0 | 0 | 1 | 1 | 1 |
| BDL | 1 | 1 | 0 | 0 | 1 | 1 | 0 | 0 |
| CDL | 1 | 1 | 1 | 0 | 0 | 0 | 0 | 1 |
| SDL | x | x | x | x | x | x | x | x |
| TDL | 1 | 0 | 0 | 0 | 0 | 0 | 0 | 0 |
| SEN | x | x | x | x | x | x | x | x |

FIG. 13

(3) PROGRAM
SDL=~(ADL&BDL&CDL)

| | STATE | | | | | | |
|---|---|---|---|---|---|---|---|
| | Er | A | | | B | | |
| | | (a) | (b) | (c) | (a) | (b) | (c) |
| XDL | x | x | x | x | x | x | x |
| ADL | 1 | 0 | 0 | 1/0 | 0 | 0 | 1/0 |
| BDL | 1 | 1 | 1 | 1 | 0 | 0 | 1/0 |
| CDL | 1 | 1 | 1 | 1 | 1 | 1 | 1 |
| SDL | 0 | 1 | 1 | 0/1 | 1 | 1 | 0/1 |
| TDL | 1 | 0 | 1/0 | 1/0 | 0 | 1/0 | 1/0 |
| SEN | 0 | 1 | 1 | 0/1 | 1 | 1 | 0/1 |

FIG. 14

(4) VL VERIFY
TDL=SEN&BDL&CDL|TDL

| | STATE | | | | | | |
|---|---|---|---|---|---|---|---|
| | Er | A | | | B | | |
| | | (a) | (b) | (c) | (a) | (b) | (c) |
| XDL | x | x | x | x | x | x | x |
| ADL | 1 | 0 | 0 | 1/0 | 0 | 0 | 1/0 |
| BDL | 1 | 1 | 1 | 1 | 0 | 0 | 1/0 |
| CDL | 1 | 1 | 1 | 1 | 1 | 1 | 1 |
| SDL | 0 | 1 | 1 | 0/1 | 1 | 1 | 0/1 |
| TDL | 1 | 0 | 1 | 1 | 0 | 1/0 | 1/0 |
| SEN | 0 | 0 | 1 | 1 | 1/0 | 1/0 | 1/0 |

FIG. 15

(5) VH VERIFY
SDL=SEN

| | STATE | | | | | | |
|---|---|---|---|---|---|---|---|
| | Er | A | | | B | | |
| | | (a) | (b) | (c) | (a) | (b) | (c) |
| XDL | x | x | x | x | x | x | x |
| ADL | 1 | 0 | 0 | 1/0 | 0 | 0 | 1/0 |
| BDL | 1 | 1 | 1 | 1 | 0 | 0 | 1/0 |
| CDL | 1 | 1 | 1 | 1 | 1 | 1 | 1 |
| SDL | 0 | 0 | 0 | 0/1 | 1/0 | 1 | 1 |
| TDL | 1 | 0 | 1 | 1 | 0 | 1/0 | 1/0 |
| SEN | 0 | 0 | 0 | 0/1 | 1/0 | 1 | 1 |

FIG. 16

(6) ADL UPDATE
ADL=SDL&BDL&CDL|ADL

| | STATE | | | | | | |
|---|---|---|---|---|---|---|---|
| | Er | A | | | B | | |
| | | (a) | (b) | (c) | (a) | (b) | (c) |
| XDL | x | x | x | x | x | x | x |
| ADL | 1 | 0 | 0 | 1 | 0 | 0 | 1/0 |
| BDL | 1 | 1 | 1 | 1 | 0 | 0 | 1/0 |
| CDL | 1 | 1 | 1 | 1 | 1 | 1 | 1 |
| SDL | 0 | 0 | 0 | 0/1 | 1/0 | 1 | 1 |
| TDL | 1 | 0 | 1 | 1 | 0 | 1/0 | 1/0 |
| SEN | 0 | 0 | 0 | 0/1 | 1/0 | 1 | 1 |

SEMICONDUCTOR MEMORY DEVICE

CROSS-REFERENCE TO RELATED APPLICATIONS

This application is based upon and claims the benefit of priority from Japanese Patent Application No. 2018-092889, filed May 14, 2018, the entire contents of which are incorporated herein by reference.

FIELD

Embodiments described herein relate generally to a semiconductor memory device.

BACKGROUND

NAND flash memories are known as one type of semiconductor memory devices. In addition, NAND flash memories including memory cells that are three-dimensionally stacked are known.

DESCRIPTION OF THE DRAWINGS

FIGS. 11 to 16 are diagrams illustrating arithmetic operation processes of a data latch circuit in a program loop.

DETAILED DESCRIPTION

Figure 1:
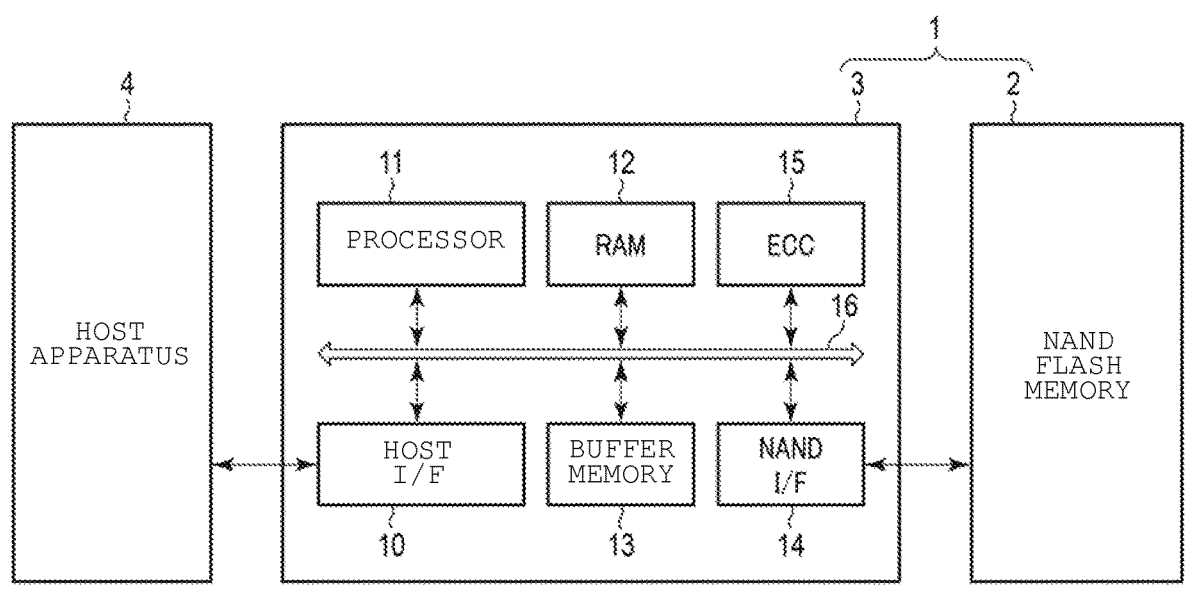
FIG. 1 is a block diagram of a memory system according to a first embodiment.

In general, according to one embodiment, a semiconductor memory device includes a memory cell array having a plurality of memory cells, a plurality of bit lines, each bit line being connected to one of the memory cells in the plurality of memory cells, and a word line commonly connected to the plurality of memory cells. A control circuit is configured to apply a program voltage to the word line and to change a voltage applied to a first bit line in the plurality of bit lines within a first period in which the program voltage is being applied to the word line.

Hereinafter, example embodiments will be described with reference to the drawings. These example embodiments illustrate devices and methods including technical concepts of the present disclosure, but the technical concepts of the present disclosure are not limited to shapes, structures, the arrangements, and the like of constituent components of the example embodiments. Furthermore, each functional block of the present description of these examples can be implemented by any one of hardware and software or a combination of both thereof in working examples. It is not essential that each described functional block as in the following example (s) is implemented as a separate or distinct block in actual, working examples. For example, some functions may be executed by different a functional block from the functional blocks illustrated as an example. In addition, each functional block illustrated may be further divided into sub blocks. Furthermore, in the following description, the same reference numeral will be assigned to elements having substantially the same function and configuration, and duplicate description may be omitted of repeated aspects, functions, or structures.

[1] First Embodiment

[1-1] Configuration of Memory System

FIG. 1 is a block diagram of a memory system 1 according to a first embodiment. The memory system 1 includes a NAND flash memory 2 and a memory controller 3.

The memory system 1 may be formed by mounting the several chips configuring the memory system 1 on a main board (motherboard) which can be mounted in a host device, or the memory system 1 may be configured as a system large-scale integrated circuit (LSI) or a system-on-chip (SoC) that is implemented as an integrated packaged component. Examples of the memory system 1 include a memory card such as an SD™ card, a solid state drive (SSD), an embedded multimedia card (eMMC), and the like.

The NAND flash memory 2 includes memory cell transistors and stores data in a nonvolatile manner.

The memory controller 3 directs the NAND flash memory 2 write, read, or erase data in response to a command from a host apparatus 4. In addition, the memory controller 3 manages a memory space of the NAND flash memory 2. The memory controller 3 includes a host interface circuit (host I/F) 10, a processor 11, a random access memory (RAM) 12, a buffer memory 13, a NAND interface circuit (NAND I/F) 14, an error checking and correcting (ECC) circuit 15, and the like. Such modules are interconnected via a bus 16.

The host interface circuit 10 is connected to the host apparatus 4 via a host bus and performs an interface process for the host apparatus 4. In addition, the host interface circuit 10 transmits/receives a command, an address, and data to/from the host apparatus 4.

The processor 11 comprises, for example, a central processing unit (CPU). The processor 11 controls the overall operation of the memory controller 3. For example, in a case in which a write command is received from the host apparatus 4, the processor 11 issues a write command based on the NAND interface protocol to the NAND flash memory 2 in response thereto. An operation performed in the case of read or erase is similar thereto. In addition, the processor 11 executes various processes for managing the NAND flash memory 2 such as wear leveling and garbage collection (compaction).

The RAM 12 is used as a work area of the processor 11 and stores therein firmware (loaded from the NAND flash memory 2), various tables generated by the processor 11, and the like. The RAM 12 comprises a DRAM and/or an SRAM. The buffer memory 13 temporarily stores data transmitted from the host apparatus 4 and temporarily stores data transmitted from the NAND flash memory 2 for subsequent transfer to the host apparatus 4. The buffer memory 13 may be provided in the RAM 12 in some examples.

When a write operation is performed, the ECC circuit 15 generates an error correcting code (ECC) for the write data, adds the error correcting code (ECC) to the write data, and transmits resultant data (e.g., write data+ECC) to the NAND interface circuit 14. In addition, when a read operation is performed, the ECC circuit 15 performs error detection and/or error correction using the error correcting code (ECC) included with the read data. In some examples, the ECC circuit 15 may be disposed inside the NAND interface circuit 14.

The NAND interface circuit 14 is connected to the NAND flash memory 2 via a NAND bus and performs an interface process with the NAND flash memory 2. In addition, the NAND interface circuit 14 transmits/receives a command, an address, and data to/from the NAND flash memory 2.

[1-1-1] Configuration of NAND Flash Memory

Figure 2:
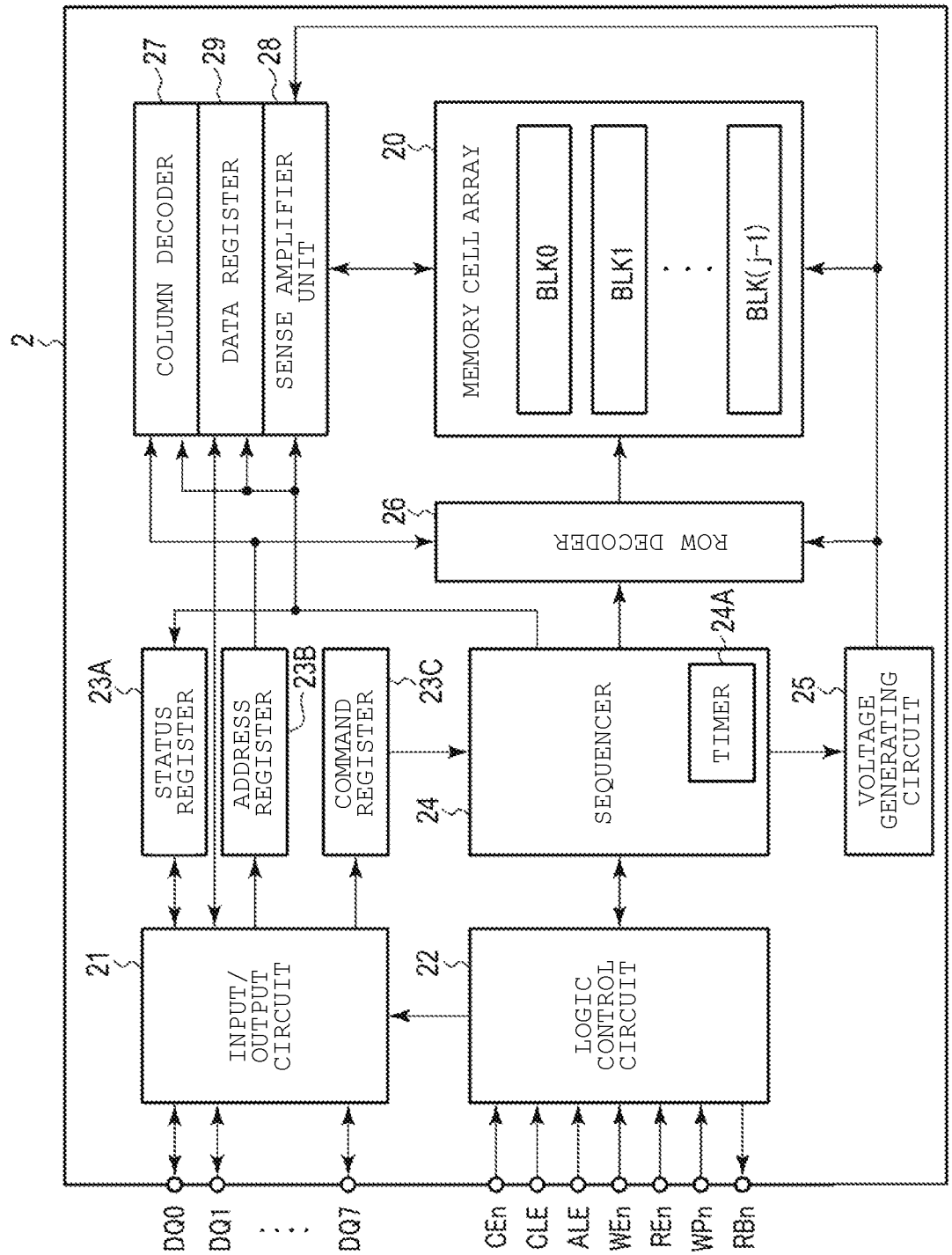
FIG. 2 is a block diagram of a NAND flash memory.

FIG. 2 is a block diagram of the NAND flash memory 2 illustrated in FIG. 1.

The NAND flash memory 2 includes a memory cell array 20, an input/output circuit 21, a logic control circuit 22, a register group (including a status register 23A, an address register 23B, and a command register 23C), a sequencer 24, a voltage generating circuit 25, a row decoder 26, a column decoder 27, a sense amplifier unit 28, and a data register 29. The sequencer 24 may be referred to as a control circuit 24 in some instances. The data register 29 may be referred to as a data cache 29 in some instances.

The memory cell array 20 includes j blocks BLK0 to BLK (j−1). Here, j is an integer of one or more. Each block BLK includes memory cell transistors. A memory cell transistor includes a memory cell that is electrically rewritable. In the memory cell array 20, in order to control a voltage applied to each memory cell transistor, bit lines, word lines, a source line, and the like are disposed. A specific configuration of the block BLK will be described later.

The input/output circuit 21 and the logic control circuit 22 are connected to the memory controller 3 via the NAND bus. The input/output circuit 21 transmits/receives a signal DQ (for example, DQ0 to DQ7) to/from the memory controller 3 via the NAND bus.

The logic control circuit 22 also receives external control signals (for example, a chip enable signal CEn, a command latch enable signal CLE, an address latch enable signal ALE, a write enable signal WEn, a read enable signal REn, and a write protection signal WPn) from the memory controller 3 via the NAND bus. Here, in the present context, when "n" is added to the signal name, this signifies that the signal is an active low signal. In addition, the logic control circuit 22 transmits a ready/busy signal RBn to the memory controller 3 via the NAND bus.

The signal CEn enables selection of the NAND flash memory 2 and is asserted when the NAND flash memory 2 is selected. The signal CLE enables a command transmitted as a signal DQ to be latched in the command register. The signal ALE enables an address transmitted as a signal DQ to be latched in the address register. The signal WEn enables data to be input to the NAND flash memory 2 via a DQ line. The signal REn enables data to be output from the NAND flash memory 2 via the DQ line. The signal WPn is asserted when write and erase are inhibited. The signal RBn represents whether the NAND flash memory 2 is in a ready state, which is a device state in which a command can be accepted from the outside, or a busy state (a device state in which a command cannot be accepted from the outside). The memory controller 3 receives the signal RBn from the NAND flash memory 2 and thus can know the present state of the NAND flash memory 2.

The status register 23A temporarily stores data that is necessary for the operation of the NAND flash memory 2. The address register 23B temporarily stores an address. The command register 23C temporarily stores a command. The status register 23A, the address register 23B, and the command register 23C comprise, for example, an SRAM.

The control circuit 24 receives a command from the command register 23C and controls the overall operation of the NAND flash memory 2 along an operating sequence based on the command. The control circuit 24 includes a timer 24A that counts a time or otherwise provides a clock time or the like. The control circuit 24 can perform timing control using a count value from the timer 24A.

The voltage generating circuit 25 receives a power source voltage from the outside of the NAND flash memory 2 and generates voltages that are necessary for a write operation, a read operation, and an erase operation using the power source voltage. The voltage generating circuit 25 supplies the generated voltages to the memory cell array 20, the row decoder 26, and the sense amplifier unit 28, the like.

The row decoder 26 receives a row address from the address register 23B and decodes the row address. The row decoder 26 performs an operation of selecting a word line and the like based on the decoded row address. Then, the row decoder 26 transmits the voltages that are necessary for a write operation, a read operation, and an erase operation to the memory cell array 20.

The column decoder 27 receives a column address from the address register 23B and decodes the column address. The column decoder 27 performs an operation of selecting a bit line based on the decoded column address.

When a read operation is performed, the sense amplifier unit 28 detects and amplifies data read from a memory cell transistor into a bit line. When a write operation is performed, the sense amplifier unit 28 transmits write data to a bit line.

When a read operation is performed, the data register 29 temporarily stores data transmitted from the sense amplifier unit 28 and transmits the data in series to the input/output circuit 21 (for example, 8 bits each time). In addition, when a write operation is performed, the data register 29 temporarily stores data transmitted in series from the input/output circuit 21 and transmits the data in parallel to the sense amplifier unit 28. The data register 29 includes an SRAM or the like.

[1-1-2] Configuration of Block BLK

Figure 3:
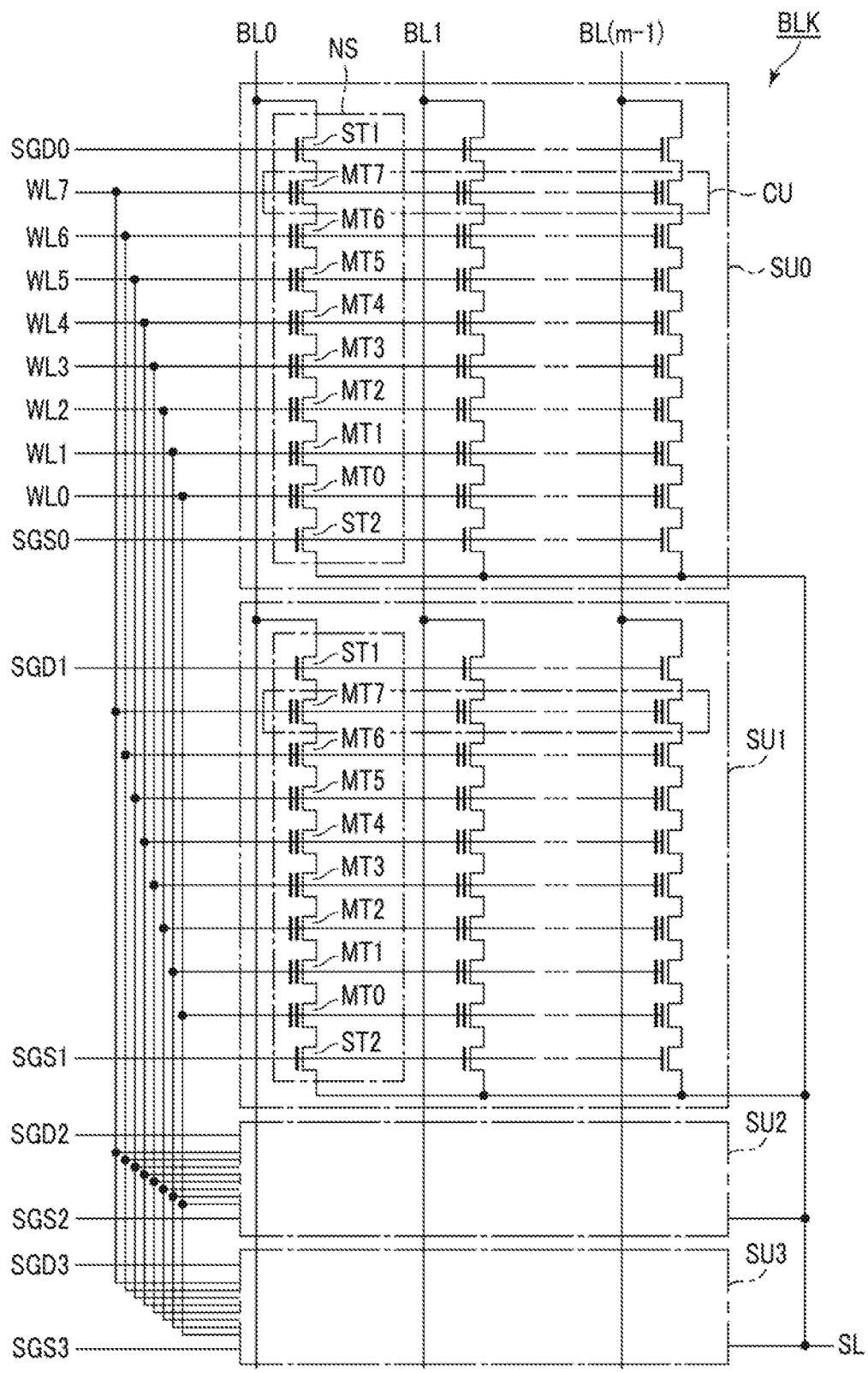
FIG. 3 is a circuit diagram of one block.

FIG. 3 is a circuit diagram of one block BLK. Each of the blocks BLK includes several string units SU. In FIG. 3, four string units SU0 to SU3 are illustrated as an example. In general, the number of string units SU in one block BLK may be freely set to any number.

Each of the string units SU includes NAND strings NS. In general, the number of NAND strings NS in one string unit SU may be freely set. NAND strings NS may also be referred to as memory strings in some contexts.

Each of the NAND strings NS includes several memory cell transistors MT and two select transistors ST1 and ST2. The memory cell transistors MT are connected in series between the source of the select transistor ST1 and the drain of the select transistor ST2. In description presented here, a memory cell transistor may also be referred to as a memory cell or a cell. FIG. 3 depicts a configuration example in which each NAND string NS includes eight memory cell transistors MT (MT0 to MT7); however, in general, the number of memory cell transistors MT in a NAND string NS is larger than that in actual devices and the total number in each memory string may be freely set to any number. Each memory cell transistor MT includes a control gate electrode and an electric charge accumulating layer and functions to store data in a nonvolatile manner. The memory cell transistor MT can store data of one bit or data of two bits or more.

Gates of the select transistors ST1 in a string unit SU0 are commonly connected to a select gate line SGD0. Similarly, select gate lines SGD1 to SGD3 are respectively connected to string units SU1 to SU3. Gates of select transistors ST2 in the string unit SU0 are commonly connected to a select gate line SGS0. Similarly, select gate lines SGS1 to SGS3 are respectively connected to the string units SU1 to SU3. In addition, a common select gate line SGS may be connected to the string units SU0 to SU3 in each block BLK. Control gates of the memory cell transistors MT0 to MT7 disposed in each block BLK are respectively connected to corresponding word lines WL0 to WL7.

Among NAND strings NS arranged in a matrix pattern inside each block BLK, drains of select transistors ST1 of NAND strings NS disposed in a same column are connected in common to one of the bit lines BL0 to BL(m−1). Here, m is an integer of one or more. In addition, each bit line BL is connected to multiple blocks BLK such that each bit line BL is connected to one NAND string NS disposed inside each string unit SU in each of the blocks BLK. Sources of select transistors ST2 in each block BLK are connected in common to the source line SL. The source line SL, for example, is connected in common to multiple blocks BLK.

Data stored in memory cell transistors MT disposed in each block BLK is erased together, for example. Reading and writing are performed on the memory cell transistors MT connected to one word line WL disposed in one string unit SU. A set of memory cell transistors MT sharing the word lines WL inside one string unit SU will be referred to as a cell unit CU. A group of data of one bit stored in each of memory cell transistors MT in a cell unit CU will be referred to a page. In other words, a write operation and a read operation for the cell unit CU are performed in units of pages.

In addition, the NAND string NS may include dummy cell transistors. More specifically, for example, two dummy cell transistors (not specifically illustrated) are connected in series between the select transistor ST2 and the memory cell transistor MT0. In addition, for example, two dummy cell transistors (not specifically illustrated) are connected in series between the memory cell transistor MT7 and the select transistor ST1. Dummy word lines are respectively connected to gates of the dummy cell transistors. The structure of a dummy cell transistor is substantially the same as that of the active (non-dummy) memory cell transistors. The dummy cell transistors are not used for storing data but have a function of alleviating disturbances received by the (active) memory cell transistors and the various select transistors during a write operation or an erase operation.

[1-1-3] Stacking Structure of Block

Figure 4:
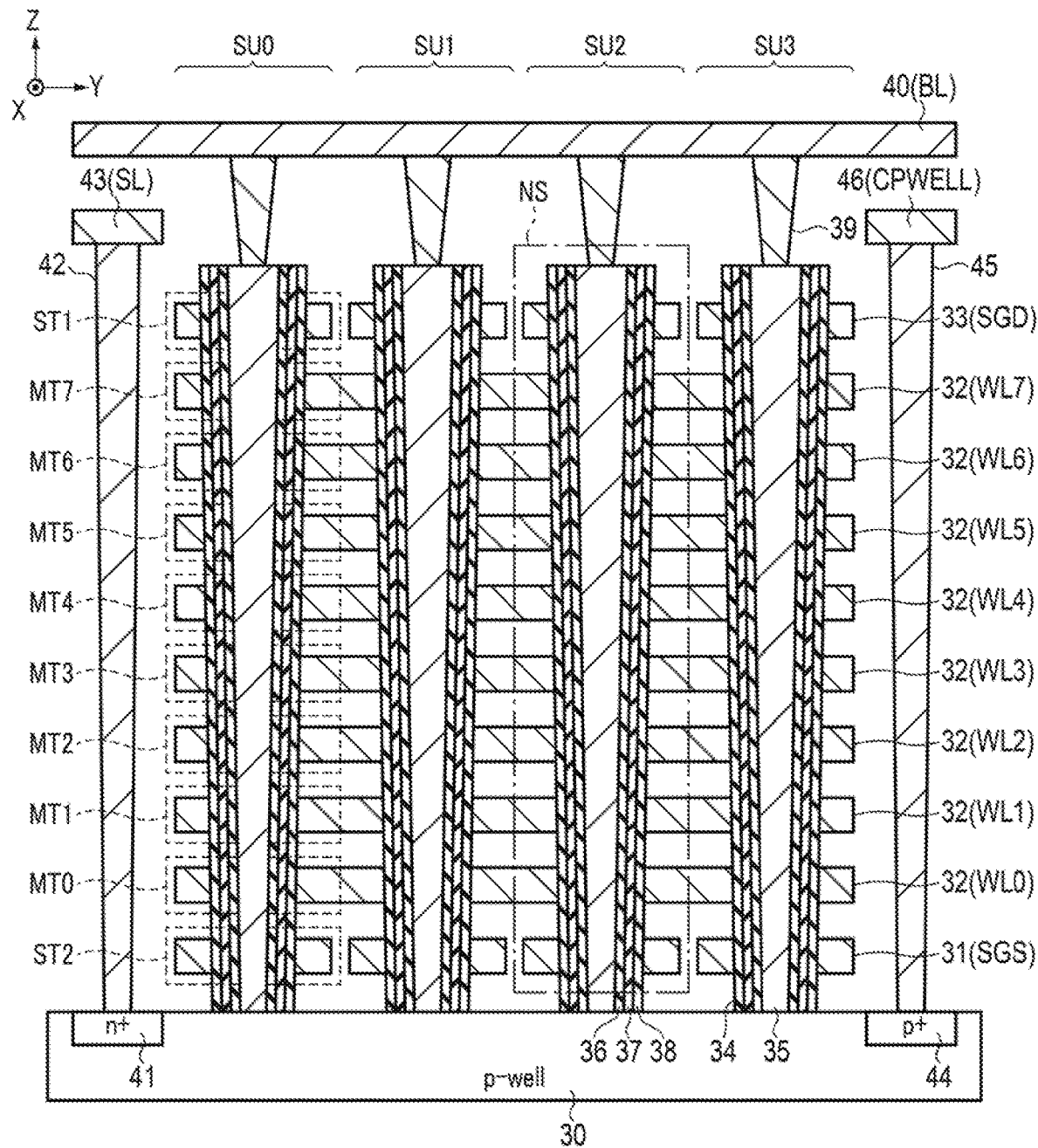
FIG. 4 is a cross-sectional diagram of a partial area of a block.

FIG. 4 is a cross-section diagram of a partial area of a block BLK. In FIG. 4, an X-direction is a direction in which the select gate lines (SGD, SGS) extend, a Y-direction that is orthogonal to the X-direction inside a horizontal plane is a direction in which bit lines extend, and a Z-direction is a stacking direction.

Inside a semiconductor layer, a p-type well region (p-well) 30 is disposed. NAND strings NS are disposed on the p-type well region 30. In other words, on the well region 30, a wiring layer 31 (functioning as a select gate line SGS), eight wiring layers 32 (functioning as word lines WL0 to WL7), and a wiring layer 33 (functioning as a select gate line SGD) are stacked in this order via insulating layers. In order to avoid complications in the drawings, hatching for the insulating layers disposed between the stacked wiring layers is omitted.

A memory hole 34 passes through the wiring layers 31, 32, and 33 reaches the well region 30. Inside the memory hole 34, a semiconductor layer 35 having a pillar shape is disposed. The semiconductor layer 35 may also be referred to as a semiconductor pillar 35. On an outer peripheral surface of the semiconductor pillar 35, a gate insulating film 36, an electric charge accumulating layer (insulating film) 37, and a block insulating film 38 are disposed in this order from the outer peripheral surface outwardly. The memory cell transistor MT and the select transistors ST1 and ST2 are thus configured by these structures. The semiconductor pillar 35 functions as a current path of the NAND string NS and is an area in which a channel of each transistor is formed. An upper end of the semiconductor pillar 35 is connected to a metal wiring layer 40 functioning as a bit line BL via a contact plug 39.

In the surface area of the well region 30, an $n^+$-type diffusion area 41 into which n-type impurities having a high density are introduced is disposed. On the diffusion area 41, a contact plug 42 is disposed, and the contact plug 42 is connected to a metal wiring layer 43 functioning as a source line SL. In addition, in the surface area of the well region 30, a $p^+$-type diffusion area 44 into which p-type impurities having a high density are introduced is disposed. On the diffusion area 44, a contact plug 45 is disposed, and the contact plug 45 is connected to a metal wiring layer 46 functioning as a well wiring CPWELL. The well wiring CPWELL is a wiring that is used for applying a voltage to the semiconductor pillar 35 via the well region 30.

The structures and arrangements described above repeated along the depth direction (X-direction) into the page of FIG. 4, and the string units SU include a set of NAND strings NS aligned along the X-direction.

[1-1-4] Threshold Distribution of Memory Cell Transistor

Figure 5:
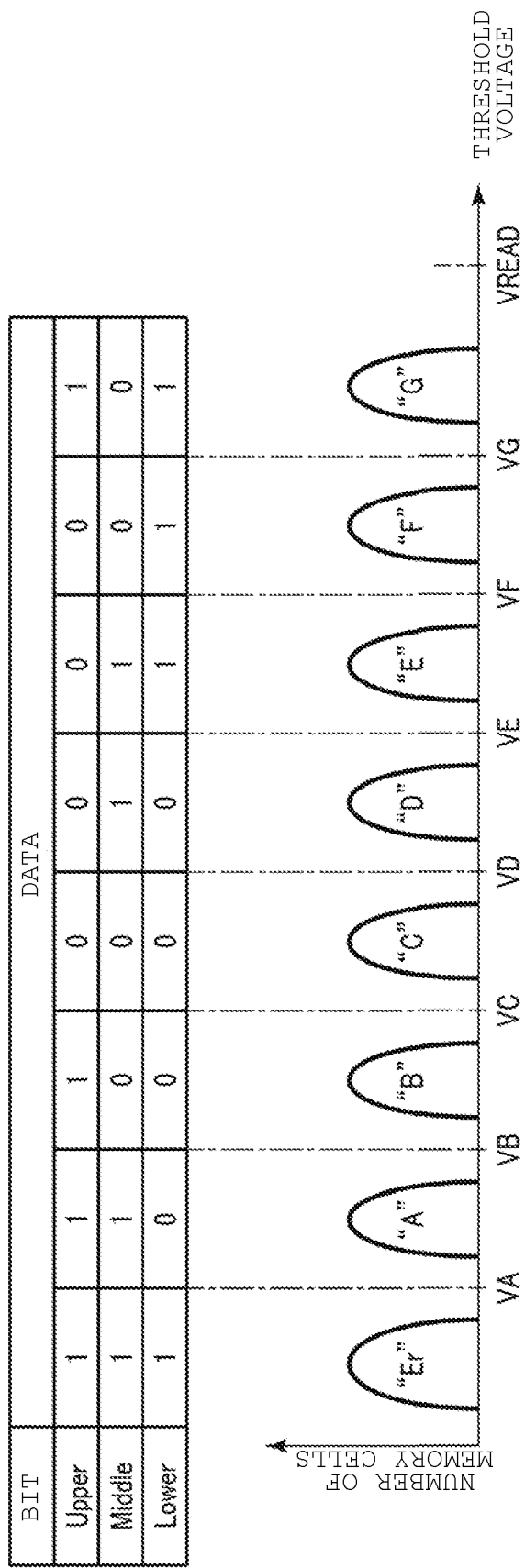
FIG. 5 is a schematic diagram illustrating one example of a threshold distribution of memory cell transistors.

Next, a distribution of threshold voltages (Vth) taken by memory cell transistors MT will be described. FIG. 5 is a schematic diagram illustrating one example of a threshold voltage distribution of memory cell transistors MT. Each of the memory cell transistors MT can store data of two bits or more. In this example embodiment, a case in which each memory cell transistor MT stores 3-bit data, in other words, a so-called triple level cell (TLC) system will be described.

The data of three bits is defined by a lower bit, a middle bit, and an upper bit. In a case in which the memory cell transistor MT stores three bits, the memory cell transistor MT can take any one of eight data states corresponding to data values. The eight states will be referred to as states "Er," "A," "B," "C," "D," "E," "F," and "G" in order of lowest to highest threshold voltage states. The individual memory cell transistors MT belonging to each of the states "Er," "A,"

"B," "C," "D," "E," "F," and "G" form a distribution about a nominal threshold value level corresponding to the state.

For example, data "111," "110," "100," "000," "010," "011," "001," and "101" are respectively assigned to states "Er," "A," "B," "C," "D," "E," "F," and "G." If an upper bit is "X," a middle bit is "Y," and a lower bit is "Z," a bit stream is "X, Y, Z." The assignment (coding) of a threshold distribution to data value may be varied.

In order to read data stored in a memory cell transistor MT that is a target for reading, a state to which a threshold voltage of the memory cell transistor MT belongs is determined. In order to determine the state, read voltages VA, VB, VC, VD, VE, VF, and VG are used.

The state "Er," corresponds to a state in which data has been erased (erased state). A threshold voltage of a memory cell transistor MT belonging to the state "Er" is lower than a voltage VA and, for example, has a negative value.

The states "A" to "G" correspond to states in which electric charge has been injected to the electric charge accumulating layer, and data has thus been written in the memory cell transistor MT. A threshold voltage of memory cell transistors MT belonging to the states "A" to "G" has a positive value, for example. A threshold voltage of a memory cell transistor MT belonging to the state "A" is higher than the read voltage VA and is read voltage VB or lower. A threshold voltage of a memory cell transistor MT belonging to the state "B" is higher than the read voltage VB and is read voltage VC or lower. A threshold voltage of a memory cell transistor MT belonging to the state "C" is higher than the read voltage VC and is read voltage VD or lower. A threshold voltage of a memory cell transistor MT belonging to the state "D" is higher than the read voltage VD and is read voltage VE or lower. A threshold voltage of a memory cell transistor MT belonging to the state "E" is higher than the read voltage VE and is read voltage VF or lower. A threshold voltage of a memory cell transistor MT belonging to the state "F" is higher than the read voltage VF and is read voltage VG or lower. A threshold voltage of a memory cell transistor MT belonging to the state "G" is higher than the read voltage VG and is lower than read voltage VREAD.

Here, the read voltage VREAD is a voltage that is applied to a word line WL connected to a memory cell transistor MT of a cell unit CU that is not being targeted for reading. The read voltage VREAD is higher than the threshold voltage of a memory cell transistor MT that is in any one of the data states. In other words, a memory cell transistor MT to which the voltage VREAD is applied to the control gate electrode thereof will be placed in an on state regardless of the data stored therein.

As above, each memory cell transistor MT is set to one of the eight data states and can store three-bit data. In addition, read and write is performed in units of pages inside one cell unit CU. In a case in which a memory cell transistor MT stores three-bit data, a lower bit, a middle bit, and an upper bit are respectively assigned to three pages inside one cell unit CU. Here, pages for which write or read is performed for the lower bit, the middle bit, and the upper bit altogether are respectively referred to as a lower page, a middle page, and an upper page.

[1-1-5] Configuration of Sense Amplifier Unit 28 and Data Register 29

Figure 6:
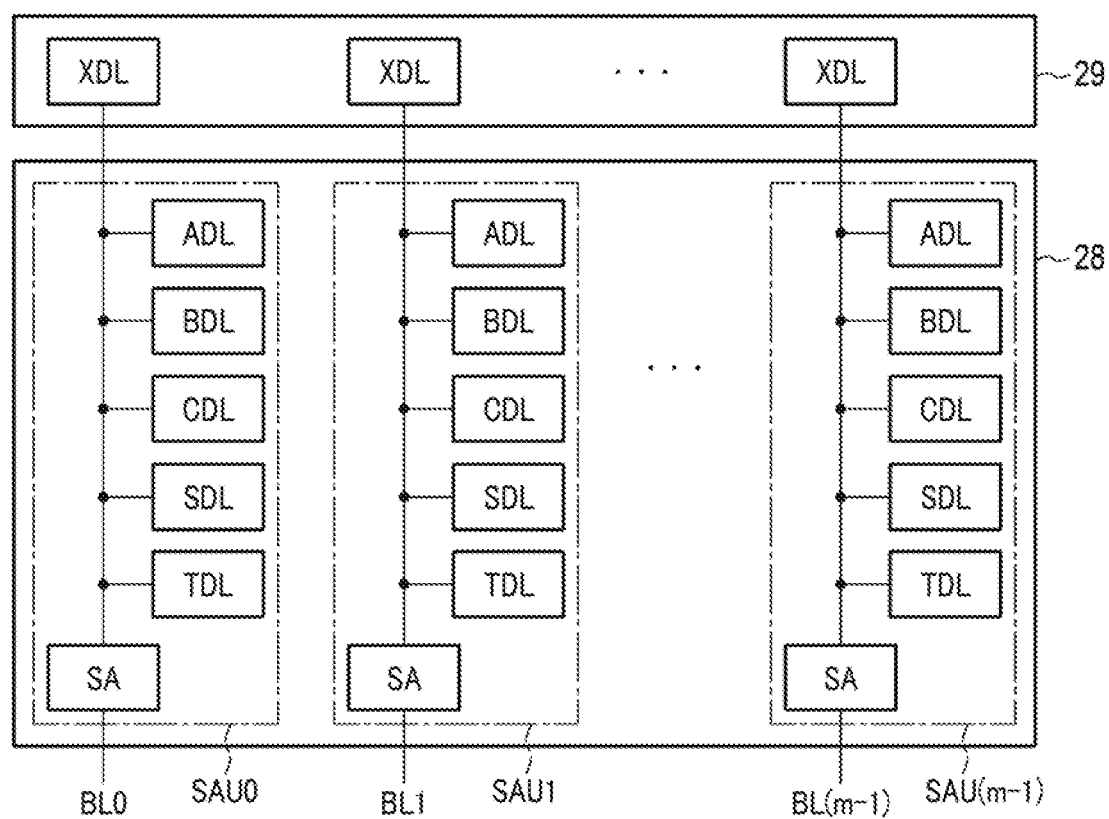
FIG. 6 is a block diagram of a sense amplifier unit and a data register.

FIG. 6 is a block diagram of the sense amplifier unit 28 and the data register 29 illustrated in FIG. 2.

The sense amplifier unit 28 includes sense amplifier units SAU0 to SAU(m-1) respectively corresponding to bit lines BL0 to BL(m-1). The sense amplifier unit SAU includes a sense amplifier SA and data latch circuits ADL, BDL, CDL, SDL, and TDL. The sense amplifier SA and the data latch circuits ADL, BDL, CDL, SDL, and TDL are connected such that data can be mutually transmitted.

The data latch circuits ADL, BDL, CDL, SDL, and TDL temporarily store data. When a write operation is performed, the sense amplifier SA controls the voltage of the bit line BL in accordance with data stored by the data latch circuit SDL. The data latch circuit TDL is used for performing a data operation inside the sense amplifier unit 28. The data latch circuits ADL, BDL, and CDL are used for a multi-value operation of the memory cell transistor MT storing data of two bits or more. In other words, the data latch circuit ADL is used for storing a lower page. In addition, the data latch circuit BDL is used for storing a middle page. The data latch circuit CDL is used for storing an upper page. The number of data latch circuits in the sense amplifier unit SAU can be freely changed in accordance with the number of bits stored by one memory cell transistor MT.

When a read operation is performed, the sense amplifier SA detects data read into a corresponding bit line BL and determines data "0" or data "1." In addition, when a write operation is performed, the sense amplifier SA applies a voltage to a bit line BL based on write data.

The data register 29 includes data latch circuits XDL corresponding to the sense amplifier units SAU0 to SAU (m-1). The data latch circuits XDL are connected to the input/output circuit 21. The data latch circuits XDL temporarily store write data transmitted from the input/output circuit 21 and temporarily store read data transmitted from the sense amplifier unit SAU. More specifically, data transmission between the input/output circuit 21 and the sense amplifier unit 28 is performed via data latch circuits XDL corresponding to one page. The write data received by the input/output circuit 21 is transmitted to one of the data latch circuits ADL, BDL, and CDL via the data latch circuit XDL. The read data read by the sense amplifier SA is transmitted to the input/output circuit 21 via the data latch circuit XDL.

(Specific Configuration Example of Sense Amplifier Unit SAU)

Figure 7:
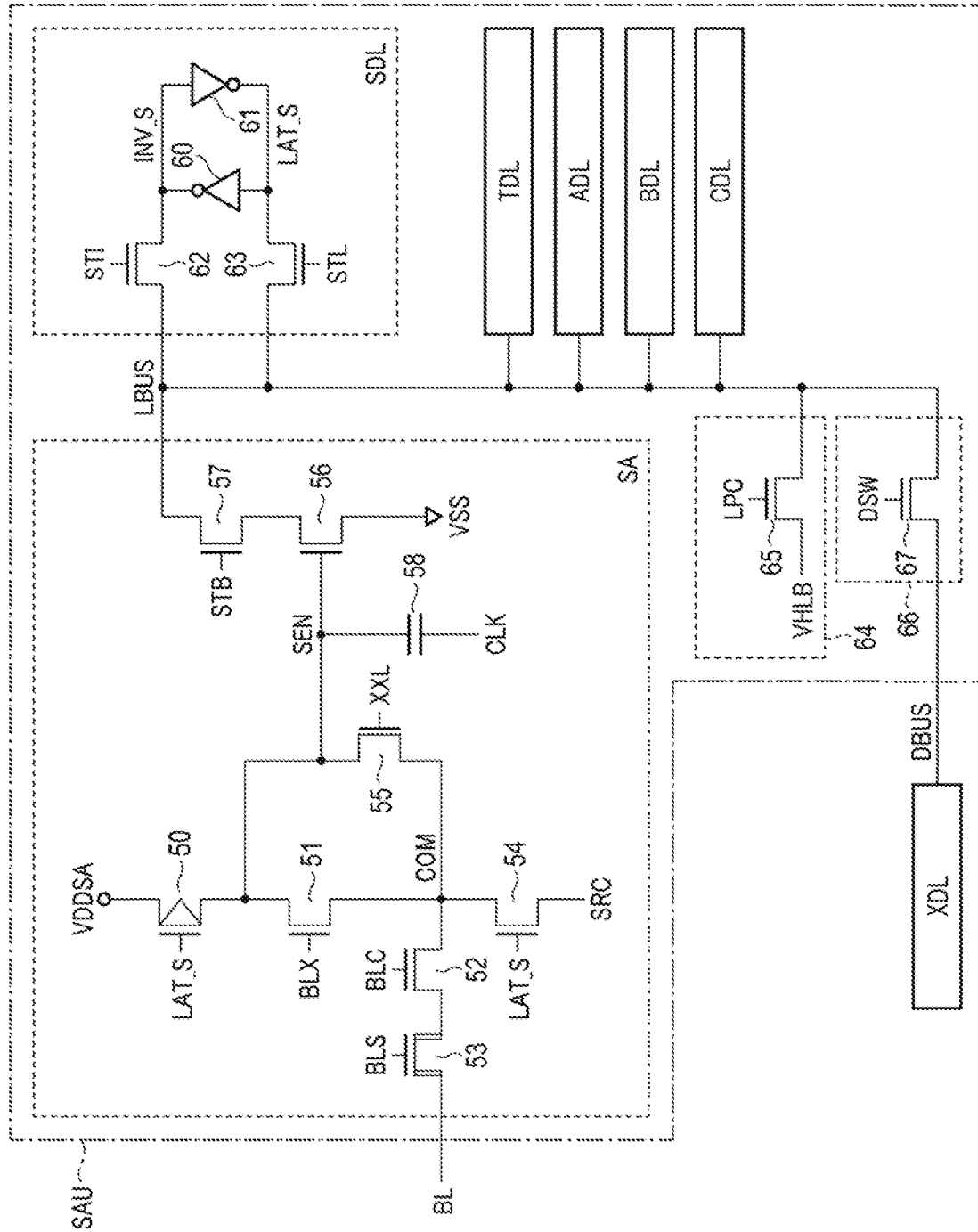
FIG. 7 is a circuit diagram of a sense amplifier unit.

Next, a specific configuration example of the sense amplifier unit SAU will be described. FIG. 7 is a circuit diagram of one sense amplifier unit SAU. Signals supplied to the sense amplifier unit SAU are generated by the sequencer 24.

The sense amplifier SA, for example, includes a p-channel MOS transistor 50, n-channel MOS transistors 51 to 57, and a capacitor 58.

The source of the transistor 50 is connected to the power source terminal to which a power source voltage VDDSA for a sense amplifier is supplied, a drain thereof is connected to a node SEN, and a gate thereof is connected to a node LAT_S disposed inside the data latch circuit SDL. The drain of the transistor 51 is connected to the node SEN, the source is connected to a node COM, and a signal BLX is input to the gate.

The drain of the transistor 52 is connected to the node COM, and a signal BLC is input to the gate. The drain of the transistor 53 is connected to the source of the transistor 52, and the source of the transistor 53 is connected to a corresponding bit line BL, and a signal BLS is input to a gate thereof. The transistor 53 is a MOS transistor having a high breakdown voltage.

The drain of the transistor 54 is connected to the node COM, the source is connected to a node SRC, and the gate is connected to the node LAT_S. For example, the ground voltage VSS is applied to the node SRC. The drain of the transistor 55 is connected to the node SEN, the source is connected to the node COM, and a signal XXL is input to the gate.

The source of the transistor 56 is connected to a ground terminal to which the ground voltage VSS is supplied, and the gate is connected to the node SEN. The source of the transistor 57 is connected to the drain of the transistor 56, the drain of the transistor 57 is connected to a bus LBUS, and a signal STB is input to the gate of the transistor 57. The signal STB is used for controlling a timing at which data read into a bit line BL is evaluated.

One electrode of the capacitor 58 is connected to the node SEN, and a clock signal CLK is input to the other electrode of the capacitor 58.

The data latch circuit SDL includes inverters 60 and 61 and n-channel MOS transistors 62 and 63. An input terminal of the inverter 60 is connected to the node LAT_S, and an output terminal thereof is connected to the node INV_S. An input terminal of the inverter 61 is connected to the node INV_S, and an output terminal thereof is connected to the node LAT_S. One end of the transistor 62 is connected to the node INV_S, the other end thereof is connected to the bus LBUS, and a signal STI is input to the gate. One end of the transistor 63 is connected to the node LAT_S, the other end thereof is connected to the bus LBUS, and a signal STL is input to the gate. For example, data maintained at the node LAT_S corresponds to data stored by the data latch circuit SDL, and data maintained at the node INV_S corresponds to inverted data of data maintained at the node LAT_S. The circuit configuration of each of the data latch circuits ADL, BDL, CDL, and TDL is similar to the circuit configuration of the data latch circuit SDL, and thus, description thereof will not be presented here.

The sense amplifier unit SAU further includes a pre-charge circuit 64 and a bus switch 66.

The pre-charge circuit 64 pre-charges the bus LBUS. The pre-charge circuit 64, for example, includes an n-channel MOS transistor 65. The drain of the transistor 65 is connected to the bus LBUS, a voltage VHLB for pre-charging is applied to the source, and a signal LPC is input to the gate. The pre-charge circuit 64 pre-charges the bus LBUS by transmitting the voltage VHLB to the bus LBUS.

The bus switch 66 connects the bus LBUS and the bus DBUS. The bus LBUS is connected to the data latch circuit XDL in the data register 29. The bus switch 66, for example, includes an n-channel MOS transistor 67. One end of the transistor 67 is connected to the bus LBUS, the other end thereof is connected to the bus DBUS, and a signal DSW is input to a gate thereof.

[1-2] Operation

The operation of the memory system 1 configured as described above will be described.

[1-2-1] Overview of Program Sequence

When a program command, an address, and write data are received from the memory controller 3, the NAND flash memory 2 executes a program sequence.

Figure 8:
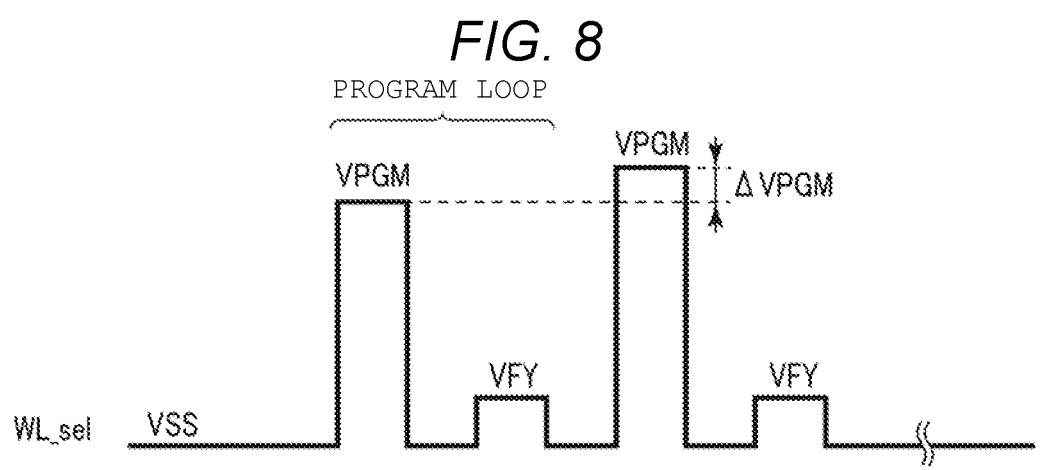
FIG. 8 is a schematic diagram illustrating a program (write) sequence.

FIG. 8 is a schematic diagram illustrating a program sequence. In FIG. 8, voltages applied to the selected word line (WL_sel) are illustrated.

The program sequence is formed of multiple program loops that are repeated. Each of the program loops includes a program operation and a verify operation.

The program operation is an operation of raising a threshold voltage of the memory cell transistor MT by injecting electric charge (electrons) into the electric charge accumulating layer of the memory cell transistor MT or maintaining the threshold voltage of the memory cell transistor MT by inhibiting injection of electrons into the electric charge accumulating layer. A program voltage VPGM is applied to a selected word line. The operation of raising the threshold voltage will be referred to as a "0" write, and the operation of maintaining the threshold voltage will be referred to as a "1" write or a "write inhibition." More specifically, a voltage applied to the bit line BL is different in "0" and "1" writes. For example, the ground voltage VSS is applied to a selected bit line BL for a "0" write, and the power source voltage VDD (VDD>VSS) is applied to a selected bit line BL for a "1" write.

A verify operation is an operation of reading data of the memory cell transistor MT after a program operation and determining whether or not the threshold voltage of the memory cell transistor MT has reached a target level. A desired verify voltage VFY (illustrated in FIG. 8) is applied to the selected word line. A case in which the threshold voltage of the memory cell transistor MT has reached the target level will be referred to as "verify passing," and a case in which the threshold voltage has not reach the target level will be referred to as "verify failing." Underlying details of the verify operation are the same as those of a read operation.

As illustrated in FIG. 8, the program voltage VPGM is set to be increased by a step-up voltage ΔVPGM every time the program loop is repeated. Accordingly, the threshold voltage of the memory cell transistor MT can be shifted in steps or stages.

Figure 9:
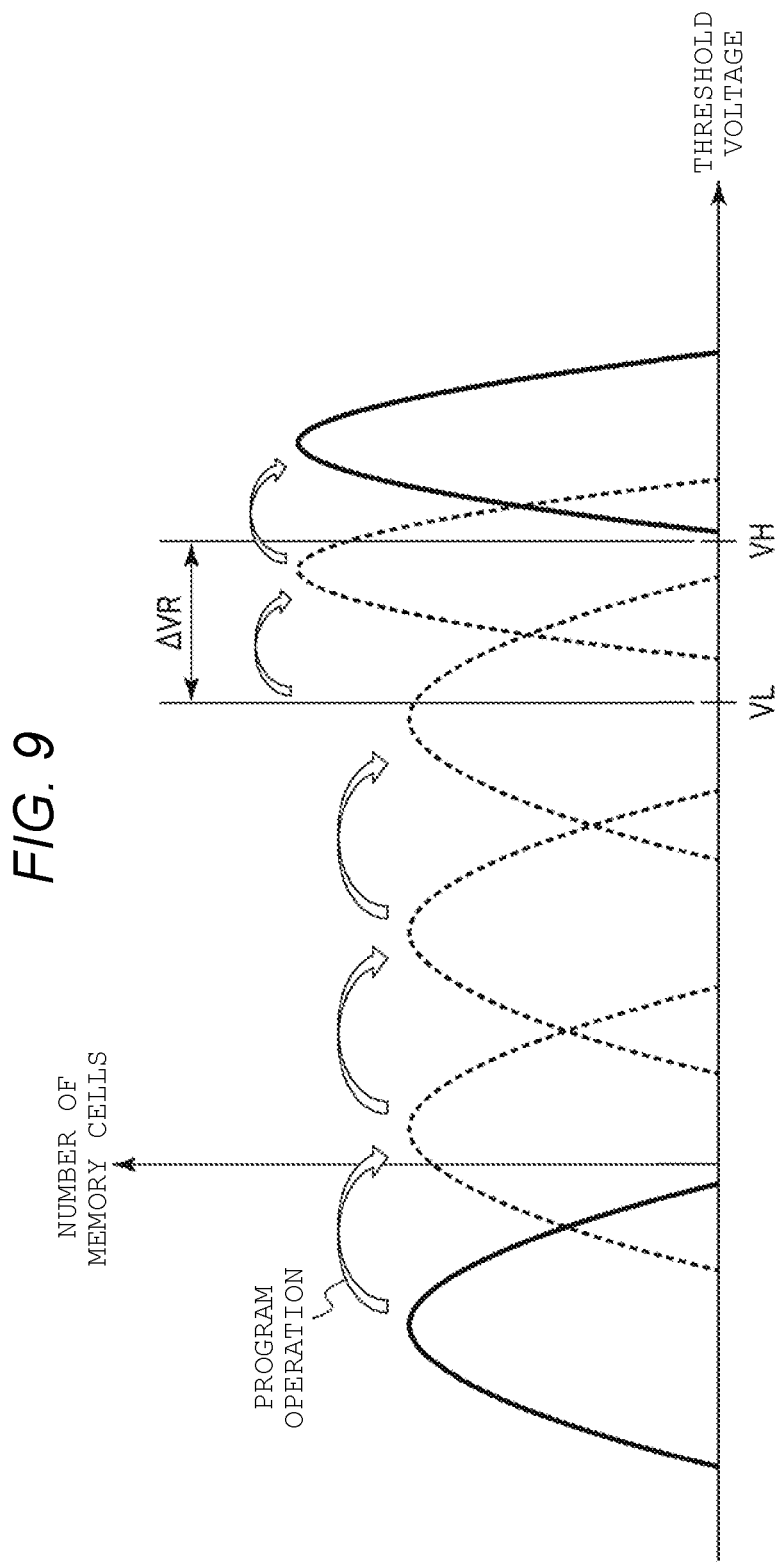
FIG. 9 is a schematic diagram illustrating a quick pass write system.

Next, a quick pass write (QPW) system will be described. FIG. 9 is a schematic diagram illustrating the QPW system.

In the QPW system, two different verify voltages VH and VL are used in the verify operation. The verify voltages VH and VL are set for each possible data state of the memory cell transistors MT. The verify voltage VL is set to be lower than the verify voltage VH by a predetermined voltage ΔVR. The verify voltage VH corresponds to a final target threshold voltage of the memory cell transistor MT. The memory cell transistor MT that passed verification using the verify voltage VH is set to be write-inhibited in a program operation performed thereafter.

In a program operation of a comparative example using the QPW system, a predetermined voltage is applied to a bit line BL that is a program target based on results of verifying using the verify voltages VH and VL. More specifically, the sense amplifier unit 28 applies, for example, the ground voltage VSS to a corresponding bit line BL in a case in which the threshold voltage of the memory cell transistor MT is lower than the verify voltage VL and applies a voltage VQPW for QPW to a corresponding bit line BL in a case in which the threshold voltage of the memory cell transistor MT is the verify voltage VL or more and lower than the verify voltage VH.

When the program voltage VPGM is applied to a selected word line in this state, as illustrated in FIG. 9, the amount of increase in the threshold voltage of the memory cell transistor MT of which the threshold voltage is the verify voltage VL or more and lower than the verify voltage VH is smaller than the amount of increase in the threshold voltage of the memory cell transistor MT of which the threshold voltage is lower than the voltage VL.

For this reason, in a program operation to which the QPW system is applied, it is prevented that the threshold voltage greatly exceeds the final target threshold voltage VH of the memory cell transistor MT, and thus the threshold distribution of states in which the program ends can be formed to be narrow.

As described above, in the QPW system of the comparative example, in addition to the power source voltage VDD (VDDSA) and the ground voltage VSS as voltages applied to the bit line BL, by using an intermediate voltage thereof, an operation as illustrated in FIG. 9 is achieved.

On the other hand, in the QPW system according to this embodiment, timings at which the power source voltage VDD and the ground voltage VSS are applied to a bit line BL are controlled by using two types of voltages including the power source voltage VDD and the ground voltage VSS without using a bit line voltage for QPW as a voltage applied to a bit line in a program operation, the operation as illustrated in FIG. 9 is achieved.

[1-2-2] Details of Program Operation

Figure 10:
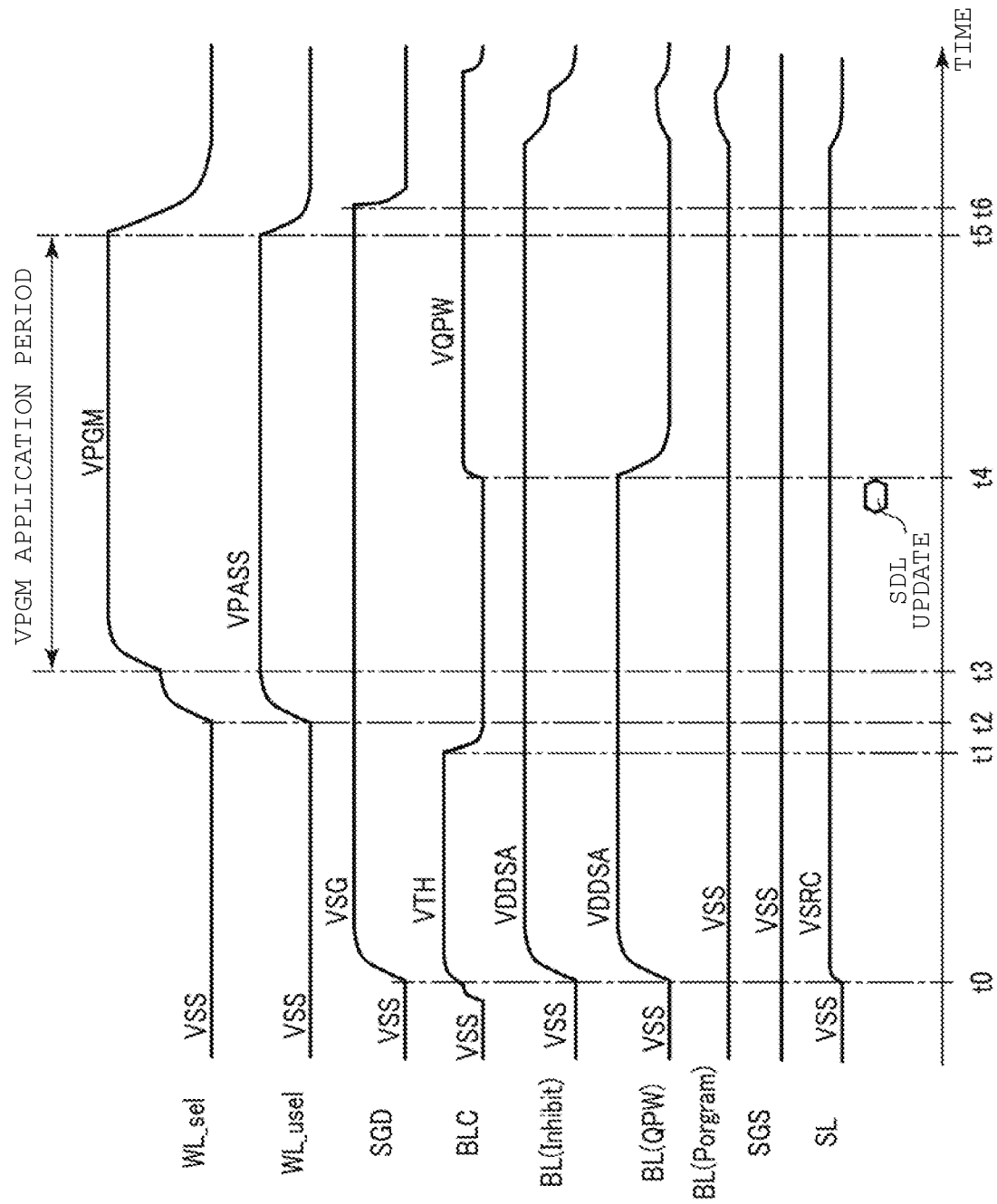
FIG. 10 is a timing diagram illustrating a program operation according to the first embodiment.

FIG. 10 is a timing diagram illustrating a program operation according to the first embodiment.

The NAND flash memory 2 receives a write command (including a program command, an address, and program data) from the memory controller 3. Thereafter, the sequencer 24 executes a program operation.

First, a bit-line charging operation is performed. At time t0, the sense amplifier unit 28 applies the ground voltage VSS (=0 V) to a bit line ("BL (Program)") that is a program target, applies the power source voltage VDDSA for a sense amplifier to a bit line ("BL(QPW)") that is a QPW target, and applies the power source voltage VDDSA to a bit line ("BL (Inhibit)") that is write-inhibited. The power source voltage VDDSA for a sense amplifier corresponds to the power source voltage VDD of the NAND flash memory 2. The bit line ("BL(Program)") that is a program target is a bit line connected to a cell of which the threshold voltage is lower than the verify voltage VL illustrated in FIG. 9. A bit line ("BL(QPW)") that is a QPW target is a bit line connected to a cell of which the threshold voltage is between the verify voltage VL and the voltage VH. A bit line ("BL (Inhibit)") that is write-inhibited is a bit line connected to a cell of which the threshold voltage is the verify voltage VH or more.

The sequencer 24 applies a voltage VTH to the gate of the transistor 52 as a signal BLC. The voltage is set as about VDDSA+Vth, which is about the threshold voltage of the transistor 52. The row decoder 26 applies a voltage VSG to the select gate line SGD and applies the ground voltage VSS to the select gate line SGS. The voltage VSG is a voltage that causes the select transistor ST1 to be in the on state. A voltage VSRC is applied to the source line SL. The voltage VSRC satisfies a relation of VSS≤Vsrc<VDDSA. Accordingly, the select transistor ST1 is turned on, and the select transistor ST2 is turned off.

As a result, in a NAND string connected to the bit line BL that is a program target, the ground voltage VSS is transmitted to the channel. In a NAND string connected to a bit line BL that is a QPW target, the power source voltage VDDSA is transmitted to the channel. In a NAND string connected to a bit line BL that is write-inhibited, the power source voltage VDDSA is transmitted to the channel.

At time t1, the sequencer 24 sets the signal BLC to be at the ground voltage VSS. Accordingly, the transistor 52 is turned off. At this time, the select gate line SGD is maintained at the voltage VSG, and the select transistor ST1 is kept on.

At time t2, the row decoder 26 applies a voltage VPASS to all the selected word lines WL ("WL_sel" illustrated in FIG. 10) and non-selected word lines WL ("WL_use1" illustrated in FIG. 10)). The voltage VPASS is a voltage causing the memory cell transistor MT to be in the on state regardless of the threshold voltage of the memory cell transistor MT.

At time t3, the row decoder 26 applies a program voltage VPGM to the selected word line WL ("WL_sel" illustrated in FIG. 10). The program voltage VPGM is a voltage that is higher than the voltage VPASS. Accordingly, in a NAND string that is a program target, an electric potential difference between the selected word line WL and the channel becomes large, and electrons are injected to the charge accumulation layer of the memory cell transistor MT. On the other hand, in a NAND string that is a QPW target or write-inhibited, an electric potential difference between the selected word line WL and the channel is smaller, and the threshold voltage of the memory cell transistor MT is maintained or kept substantially unchanged.

At time t4, the sequencer 24 sets the signal BLC to be at a voltage VQPW. The voltage VQPW has a relation of VSS+Vtn<VQPW<VDDSA+Vtn. A voltage Vtn is the threshold voltage of the n-channel MOS transistor 52. Accordingly, the transistor 52 is turned on. The sense amplifier unit 28 applies the ground voltage VSS to the bit line BL that is a QPW target. At this time point, in a NAND string that is a QPW target, an electric potential difference between the selected word line WL and the channel becomes large, and electrons are injected to the charge accumulation layer of the target memory cell transistor MT.

At time t5, the row decoder 26 applies the ground voltage VSS to all the word lines WL. A period t3 to t5 is a period of applying the program voltage VPGM ("VPGM applying period" in FIG. 10). At time t6, the row decoder 26 applies the ground voltage VSS to the select gate line SGD. Thereafter, the bit line BL and the source line SL are reset, and thereafter, the signal BLC is reset.

As illustrated in FIG. 10, a time at which an electric potential difference between the selected word line WL and the channel is different in a cell that is a program target and a cell that is a QPW target. More specifically, the electric potential difference is large in a period t3 to t5 in the cell that is a program target, and the electric potential difference is large only in a period t4 to t5 in the cell that is a QPW target. Accordingly, many more electrons are injected to the charge accumulation layer in the cell that is a program target, as compared to the number of electrons injected to the charge accumulation layer in the cell that is a QPW target. As a result, in the cell that is a QPW target, the amount of shift in the threshold voltage can be set to be small.

The timing of time t4 can be controlled using the timer 24A. In addition, the timing of the time t4 can be appropriately set in accordance with the known characteristics of the memory cell transistors being written/programmed.

[1-2-3] Arithmetic Operation Process of Data Latch Circuit

Next, one example of an arithmetic operation process of a data latch circuit in a program loop will be described. FIGS. 11 to 16 are diagrams illustrating an arithmetic operation process of a data latch circuit in a program loop.

The sequencer 24 transmits program data received from the memory controller 3 to the data latch circuits ADL, BDL, and CDL (data-in). As illustrated in FIG. 11, an upper page, a middle page, and a lower page are respectively stored in the latch circuits ADL, BDL, and CDL. A value of "x" illustrated in FIG. 11 represents an undefined state.

Next, as depicted in FIG. 12, the sequencer 24 executes an arithmetic operation "TDL=ADL&BDL&CDL" and initializes the latch circuit TDL of any state other than the state "Er" to data "0". Here, the operator "&" in an arithmetic operation representing a logical product. In addition, since the state "Er" is always write-inhibited, the latch circuit TDL is set to data "1" for this state.

Hereinafter, a program operation of the state "A" will be described as an example. In FIGS. 13 to 16, data for only the states "Er," "A," and "B" is illustrated.

FIG. 13 illustrates data of data latch circuits at the time of executing the program operation. FIG. 13 illustrates three cases (a), (b), and (c) for the state "A." The sequencer 24 updates the data of a latch circuit SDL by executing an arithmetic operation "SDL=~(ADL&BDL&CDL)," where the operator "~" in the arithmetic operation representing negation. The entry "1/0" illustrated in FIG. 13 represents that the particular value ("1" or "0") stored in the corresponding register does not matter. The entry "0/1" illustrated in FIG. 13 represents that data value "0" or "1" is stored in accordance with a data evaluation result. In a case in which data "1" is stored by the latch circuit SDL, the ground voltage VSS is applied to the bit line BL. On the other hand, in a case in which data "0" is stored by the latch circuit SDL, the power source voltage VDDSA is applied to the bit line BL.

FIG. 14 illustrates a result of a verification operation ("VL VERIFY") using the verify voltage VL, which the electric potential of a data line BL transmits. The sequencer 24 maintains a result of an arithmetic operation "TDL=SEN&BDL&CDL|TDL" in the latch circuits. In accordance with the VL verification, the electric potential of the bit line is transmitted to the node SEN, and the data of the latch circuit TDL is updated. The operator "|" in the arithmetic operation equation above represents a logical sum operation. The result of the VL verification is maintained in the latch circuit TDL. In FIG. 14, a case (a) is an example in which a result of the VL verification is a fail and cases (b) and (c) are examples in which a result of the VL verification is a pass. In a case in which the result of the verification is a fail, data "0" is maintained at the node SEN. On the other hand, in a case in which the result of the verification is a pass, data "1" is maintained at the node SEN.

FIG. 15 illustrates a process of maintaining a result of a verification operation using the verify voltage VH ("VH VERIFY") in data latch circuits. In accordance with the VH verification operation, the electric potential of a bit line BL is transmitted to the node SEN. The sequencer 24 transmits data maintained at the node SEN to the latch circuit SDL (SDL=SEN) and updates the data of the latch circuit SDL. The result of the VH verification is maintained in the latch circuit SDL. In FIG. 15, cases (a) and (b) are examples in which a result of the VH verification is a fail.

FIG. 16 illustrates a process of transmitting a result of VH verification to a latch circuit ADL. The sequencer 24 executes an arithmetic operation "ADL=SDL&BDL&CDL|ADL" and updates the data of the latch circuit ADL. A case (a) illustrated in FIG. 16 is the case of a bit line that is a program target, a case (b) illustrated in FIG. 16 is the case of a bit line that is a QPW target, and a case (c) illustrated in FIG. 16 is the case of a bit line that is write-inhibited.

More specifically, in the case (c) illustrated in FIG. 16, a case in which a result of the VH verification is a pass (in other words, a result of the verification of the state "A" is a pass), the data of the latch circuit SDL becomes data "1," and the latch circuit ADL is updated to be data "1." Accordingly, in the case (c) illustrated in FIG. 16, data of the latch circuits ADL, BDL, and CDL is the same as that of the state "Er." Accordingly, in any program loop executed thereafter, the bit line corresponding to the case (c) illustrated in FIG. 16 is write-inhibited.

In the case (b) illustrated in FIG. 16, the data of the latch circuit TDL is data "1," and the data of the latch circuit SDL is data "0," and accordingly, the VL verification is a pass, and the VH verification is a fail. Accordingly, the case (b) illustrated in FIG. 16 is the case of the bit line that is a QPW target.

At this time point, in the sequencer 24, a bit line BL that is a QPW target (the case (b) illustrated in FIG. 16) is specified in the next program loop. The sequencer 24 rewrites (updates) the data "1" of the latch circuit TDL in a latch circuit SDL corresponding to the bit line that is a QPW target at the timing of time t4 illustrated in FIG. 10. Accordingly, the ground voltage VSS can be applied to the bit line BL that is a QPW target at the time t4.

[1-3] Effect of First Embodiment

In a QPW system in the related art, in order to prevent an increase in the amount of change in the threshold according to execution of a program each time, the voltage VQPW for QPW is applied to a bit line that is a QPW target. Accordingly, a spread of the upper base of the threshold distribution (a state in which the number of memory cells having threshold voltages higher than a threshold voltage of a desired range) can be improved. There is a tendency of lowering the external power source voltage, a margin of the voltage VSGD of the select gate line SGD is decreased.

Figure 17:
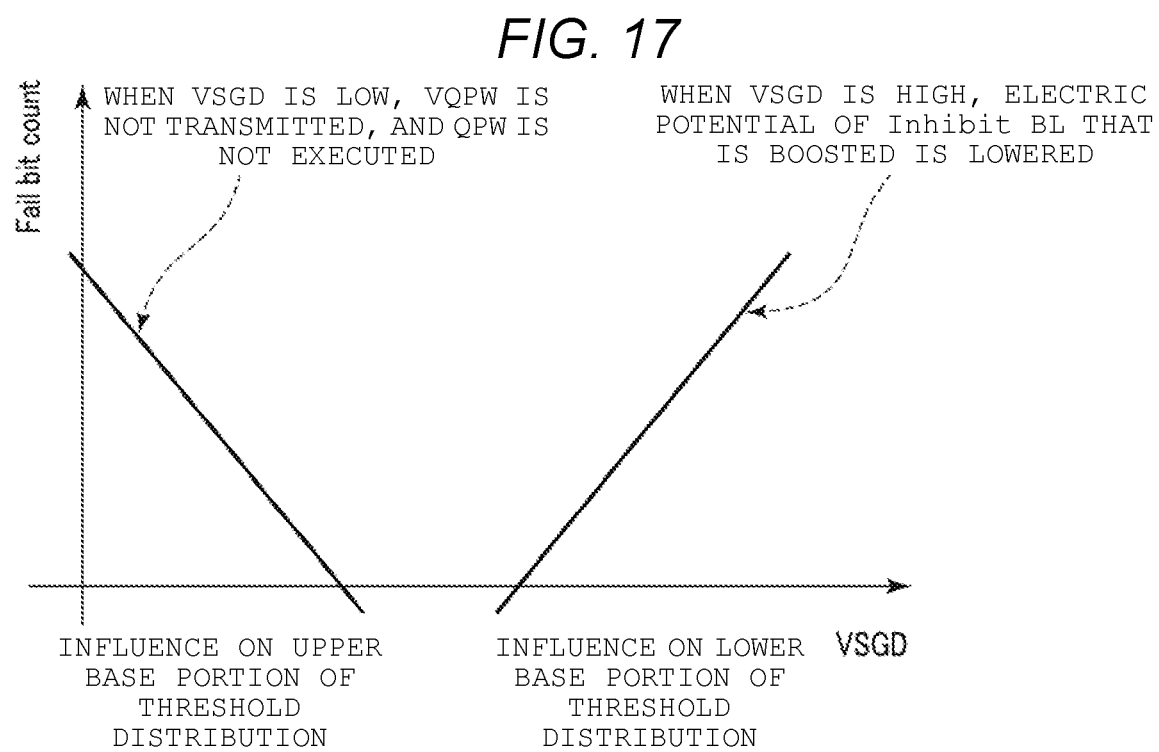
FIG. 17 is a diagram illustrating a relation between a voltage of a select gate line and a fail bit count.

FIG. 17 is a diagram illustrating a relation between the voltage VSGD of the select gate line SGD and a fail bit count. The fail bit count is the number of cells that fail when read, in other words, the number of cells storing data other than an expected value (corresponding to the previously applied program data) when they are read.

When the voltage VSGD, which is a gate level of the select transistor ST1, is lowered, transmission of a voltage from a bit line to a NAND string through the select transistor ST1 is prevented. Accordingly, the voltage VQPW applied to a bit line that is a QPW target is not appropriately transmitted to the channel of the NAND string, and the amount of increase in the threshold voltage cannot be appropriately limited. Accordingly, the upper tail portion of the threshold distribution is influenced.

In addition, the electric potential of the channel of the NAND string connected to a bit line that is write-inhibited is boosted in accordance with coupling with a word line to which the voltage VPASS is applied. When the voltage VSGD becomes high, electric charge of the boosted channel are extracted to the power source VDDSA side via the select transistor ST1, and the electric potential of the channel (and the bit line that is write-inhibited) is lowered. When the voltage VPGM is applied to the selected word line in this state, the threshold of the cell that is write-inhibited changes unintentionally. Accordingly, a lower tail portion of the threshold distribution is influenced.

In addition, when the power source voltage VDDSA applied to a bit line that is write-inhibited becomes low, the voltage VSGD of the select gate line SGD cannot be set high. Accordingly, the margin of the voltage VSGD decreases.

In contrast to this, according to the first embodiment, the control circuit 24 changes a voltage applied to a first bit line that is a QPW target within a first period in which the program voltage VPGM is applied to a selected word line WL. More specifically, the control circuit 24 (1) applies the power source voltage VDDSA to the first bit line at a first time within the first period and (2) applies the ground voltage VSS to the first bit line at time t2 that is within the first period and after the time t1.

Therefore, according to the first embodiment, a QPW system can be implemented without using the voltage VQPW for a QPW as in the related art. Accordingly, a semiconductor memory device capable of improving write performance can be provided.

In addition, since this improved QPW system can be provided, the threshold distribution of each programmed data state can be narrowed.

Furthermore, the select transistor ST1 connected to the select gate line SDG may be configured to be able to transmit the power source voltage VDDSA to the bit line BL. Accordingly, the margin of the voltage VSDG applied to the select gate line SDG can be increased. As a result, also in a case in which the power source voltage VDDSA is set to be low, the QPW system can be provided.

[2] Second Embodiment

According to the first embodiment, in a case in which a bit line adjacent to a bit line that is a QPW target is a bit line that is write-inhibited, when the bit line that is the QPW target is discharged, the write-inhibited bit line may be subjected to down-noise due to a coupling capacitance. In a second embodiment, after a bit line that is write-inhibited is started to be changed, a bit line that is a QPW target is started to be charged. In this case, at a timing at which the bit line that is the QPW target is charged, the electric potential of the bit line that is write-inhibited goes up due to the coupling capacitance. Then, even when the write-inhibited bit line is subjected to down-noise when discharging the bit line that is the QPW target, the electric potential of the bit line that is write-inhibited is prevented from falling down to the electric potential for program.

Figure 18:
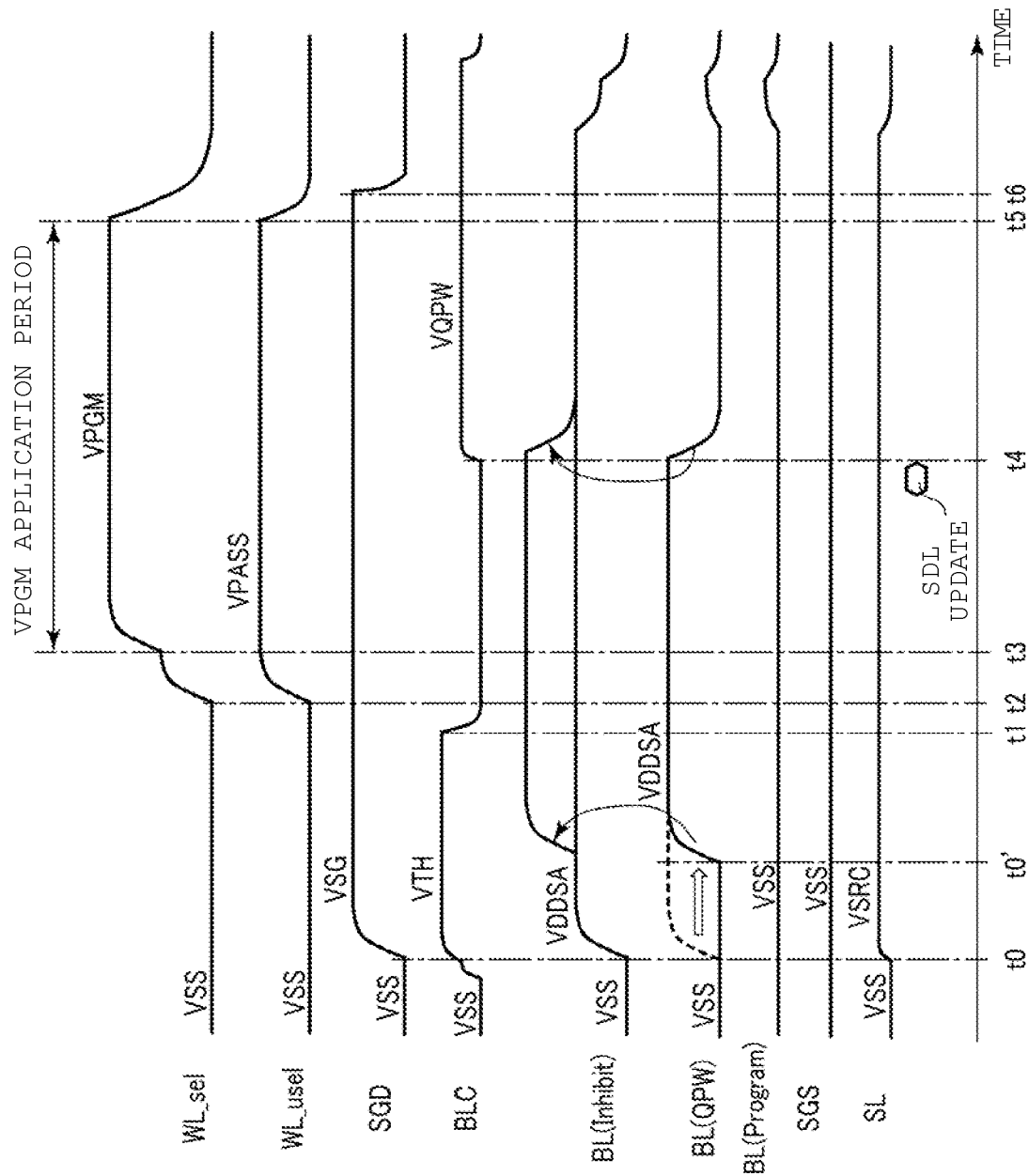
FIG. 18 is a timing diagram illustrating a program operation according to a second embodiment.

FIG. 18 is a timing diagram illustrating a program operation according to the second embodiment. Hereinafter, only operations different from those according to the first embodiment will be described.

At time t0, a sense amplifier unit 28 applies a power source voltage VDDSA to a bit line BL that is write-inhibited.

At time t0', the sense amplifier unit 28 applies the power source voltage VDDSA to a bit line BL that is a QPW target. In other words, a timing at which the voltage of the bit line BL that is the QPW target is raised is after a timing at which the voltage of a bit line BL that is write-inhibited is raised. The voltage of a bit line BL which is write-inhibited and adjacent to the bit line BL that is the QPW target goes up to be higher than the power source voltage VDDSA due to a coupling capacitance.

At time t4, the sense amplifier unit 28 applies ground voltage VSS to the bit line BL that is the QPW target. The voltage of the bit line BL which is write-inhibited and adjacent to the bit line BL that is the QPW target falls down to about the power source voltage VDDSA due to a coupling capacitance.

According to the second embodiment, the voltage of the bit line BL that is write-inhibited can be prevented from being lower than the power source voltage VDDSA. Accordingly, erroneous writing in a NAND string connected to the bit line BL that is write-inhibited can be prevented.

[3] Third Embodiment

According to a third embodiment, the number of bit lines that are QPW targets is counted, and a discharge current amount of the bit lines that are the QPW targets is adjusted in accordance with this counted value. Thus, down-noise applied to a bit line that is write-inhibited due to a coupling capacitance can be reduced.

[3-1] Peripheral Circuit of Sense Amplifier

Figure 19:
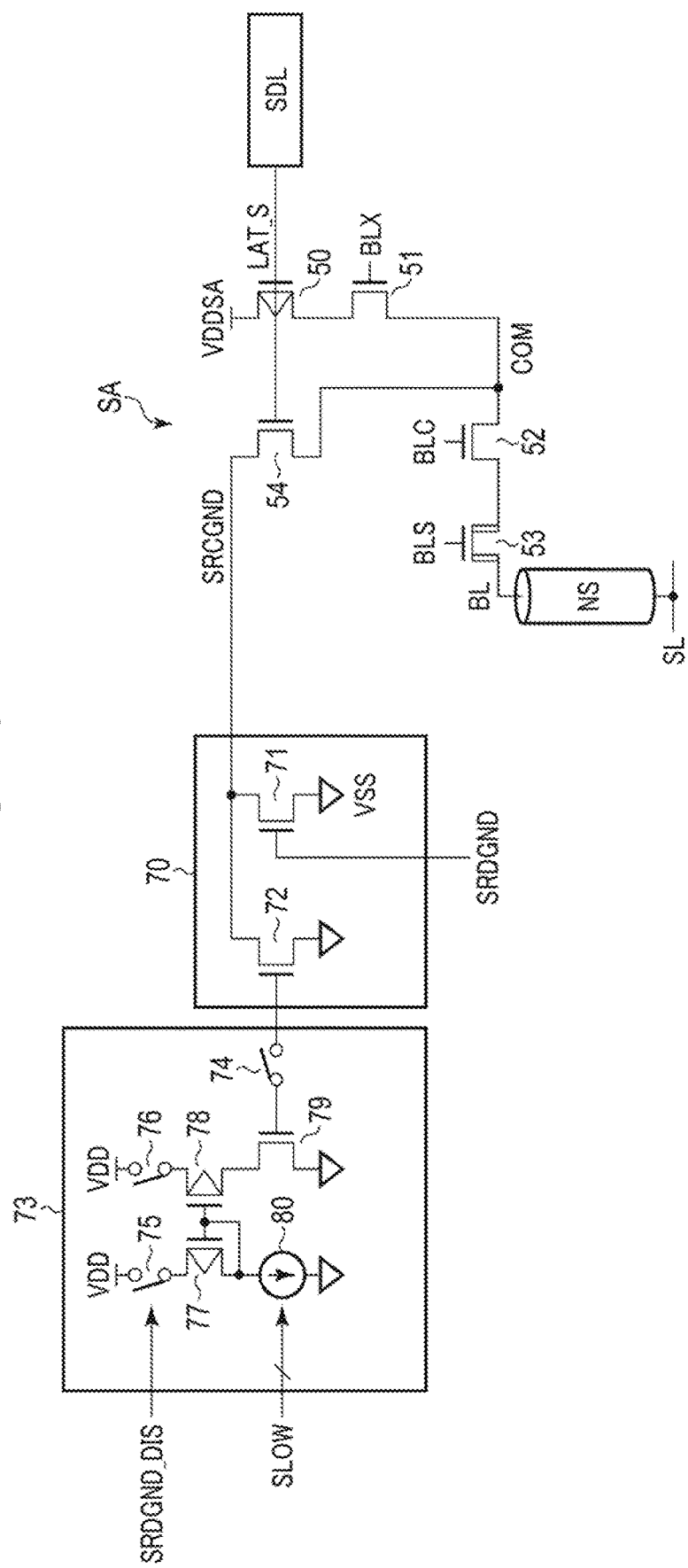
FIG. 19 is a circuit diagram of a peripheral circuit of a sense amplifier.

FIG. 19 is a circuit diagram of a peripheral circuit of a sense amplifier SA. The sense amplifier unit 28 includes a discharge circuit 70 that discharges a bit line BL and a current adjusting circuit 73. The signals supplied to the discharge circuit 70 and the current adjusting circuit 73 are generated by a sequencer 24.

The discharge circuit 70 includes n-channel MOS transistors 71 and 72. The drain of the transistor 71 is connected to a signal line SRCGND, the source thereof is connected to a ground terminal, and a signal SRDGND is input to the gate thereof. The signal line SRCGND is connected to the source of a transistor 54 in the sense amplifier SA illustrated in FIG. 7. The drain of the transistor 72 is connected to the signal line SRCGND, the source thereof is connected to the ground terminal, and the gate thereof is connected to a current adjusting circuit 73.

The current adjusting circuit 73 includes a current mirror circuit. The current adjusting circuit 73 includes: switching devices 74 to 76; p-channel MOS transistors 77 and 78; an n-channel MOS transistor 79; and a variable current source 80.

One end of the switching device 75 is connected to a power source terminal to which the power source voltage VDD is supplied, and the other end thereof is connected to a source of the transistor 77. The drain and gate of the transistor 77 are connected to one end of the variable current source 80. The other end of the variable current source 80 is connected to the ground terminal.

One end of the switching device 76 is connected to the power source terminal to which the power source voltage VDD is supplied, and the other end thereof is connected to a source of the transistor 78. The gate of the transistor 78 is connected to the gate of the transistor 77, and the drain thereof is connected to the drain of the transistor 79. The gate of the transistor 79 is connected to one end of the switching device 74, and the source thereof is connected to the ground terminal. The other end of the switching device 74 is connected to the discharge circuit 70.

A signal SRDGND_DIS is input to the switching devices 74 to 76. The signal SRDGND_DIS is asserted in a case in which current control of a bit line discharging side is performed. In a case in which the signal SRDGND_DIS is asserted, the switching devices 74 to 76 are turned on.

A signal SLOW of multiple bits is input to the variable current source 80. The variable current source 80 controls a current in accordance with a digital/analog conversion (DAC) value of the signal SLOW. When the signal SRDGND_DIS is asserted, a current flowing through the variable current source 80 is mirrored in the transistor 72. Accordingly, the amount of current discharging the signal line SRCGND can be adjusted in accordance with the DAC value of the signal SLOW.

In addition, one discharge circuit 70 and one current adjusting circuit 73 are disposed for every one of the sense amplifier units SAU (for example, 16 sense amplifier units SAU) or all the sense amplifier units SAU.

[3-2] Operation

Figure 20:
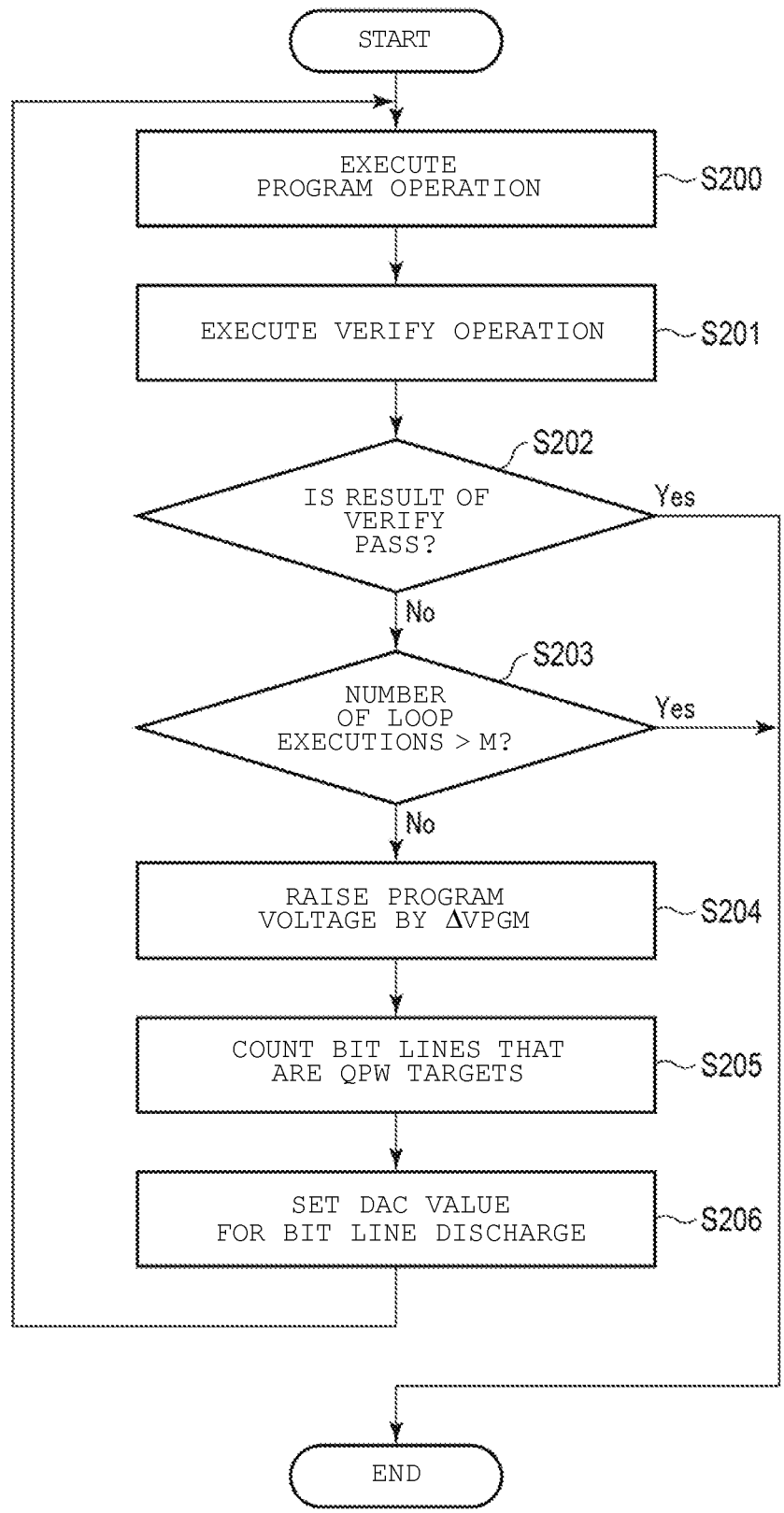
FIG. 20 is a flowchart illustrating a program sequence according to a third embodiment.

FIG. 20 is a flowchart illustrating a program sequence according to a third embodiment.

The sequencer 24 executes a program operation including an operation of applying a program voltage to a selected word line (Step S200).

Subsequently, the sequencer 24 executes a verify operation (Step S201). In a case in which a result of the verify operation is a pass (Step S202=Yes), the sequencer 24 ends the program sequence.

On the other hand, in a case in which a result of the verify operation is a fail (Step S202=No), the sequencer 24 determines whether or not the number of times the program loop has been executed (total number of loop executions) exceeds M (Step S203). In a case in which the loop execution number of times exceeds M (Step S203=Yes), the sequencer 24 ends the program sequence.

On the other hand, in a case in which the number of times of execution of program loops is M or less (Step S203=No), the sequencer 24 increases the program voltage VPGM by a step-up voltage ΔVPGM (Step S204).

Subsequently, the sequencer 24 counts the number of bit lines that are QPW targets (Step S205). For example, the sequencer 24 counts the number of data latch circuits storing information of the QPW targets.

Subsequently, the sequencer 24 sets a DAC value for bit line discharging in accordance with the number of the bit lines that are the QPW targets (Step S206). More specifically, the sequencer 24 decreases the DAC value, in other words, a discharge current as the number of bit lines that are QPW targets is increased.

Here, a timing at which the DAC value of bit line discharging is changed is not limited to that illustrated in FIG. 20. For example, the DAC value for bit line discharging may be changed after a predetermined number of program loops. In addition, the DAC value for bit line discharging may be fixed for each program sequence.

Figure 21:
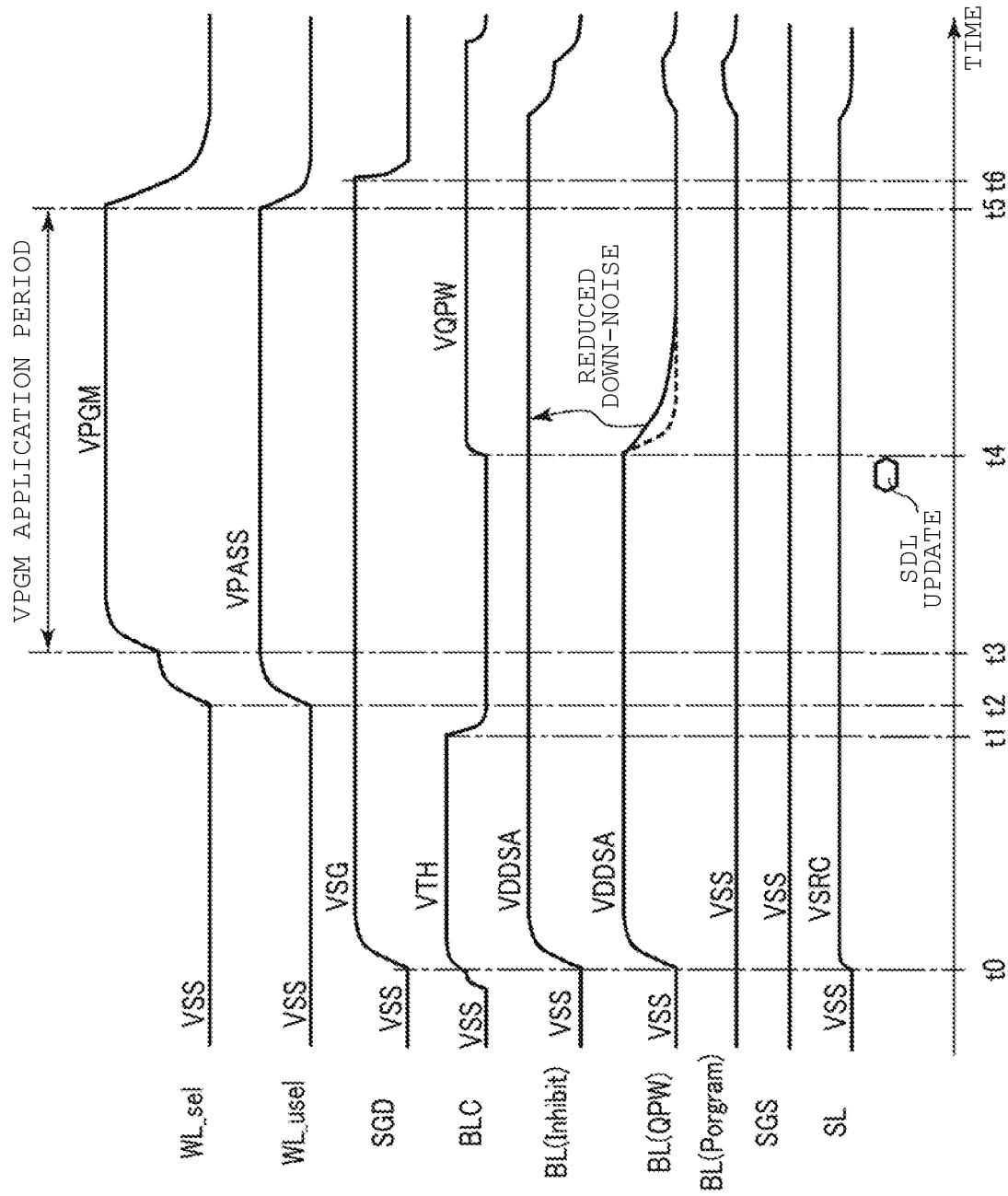
FIG. 21 is a timing diagram illustrating a program operation according to the third embodiment.

FIG. 21 is a timing diagram illustrating a program operation according to the third embodiment. The flow of the program operation is substantially the same as that described in the first embodiment with reference to FIG. 10. The amount of current according to the current adjusting circuit 73 is set using the sequencer 24.

At time t4, the discharge circuit 70 and the current adjusting circuit 73 decrease a discharge current of the bit line BL that is a QPW target. Accordingly, the electric potential of the bit line BL that is a QPW target gradually decreases. As a result, the influence of down-noise on a write-inhibited bit line BL adjacent to the bit line BL that is the QPW target is reduced.

According to the third embodiment, a drop of the voltage of the write-inhibited bit line BL due to the down-noise can be prevented. Accordingly, in a NAND string connected to the bit line BL that is write-inhibited, erroneous write can be prevented.

[4] Fourth Embodiment

According to a fourth embodiment, program of multiple values (states) is executed by an operation of applying a program voltage VPGM once. For this reason, in a VPGM applying period, bit lines BL are changed from a power source voltage VDDSA for write inhibition to a ground voltage VSS for program in order of highest to lowest data state.

Figure 22:
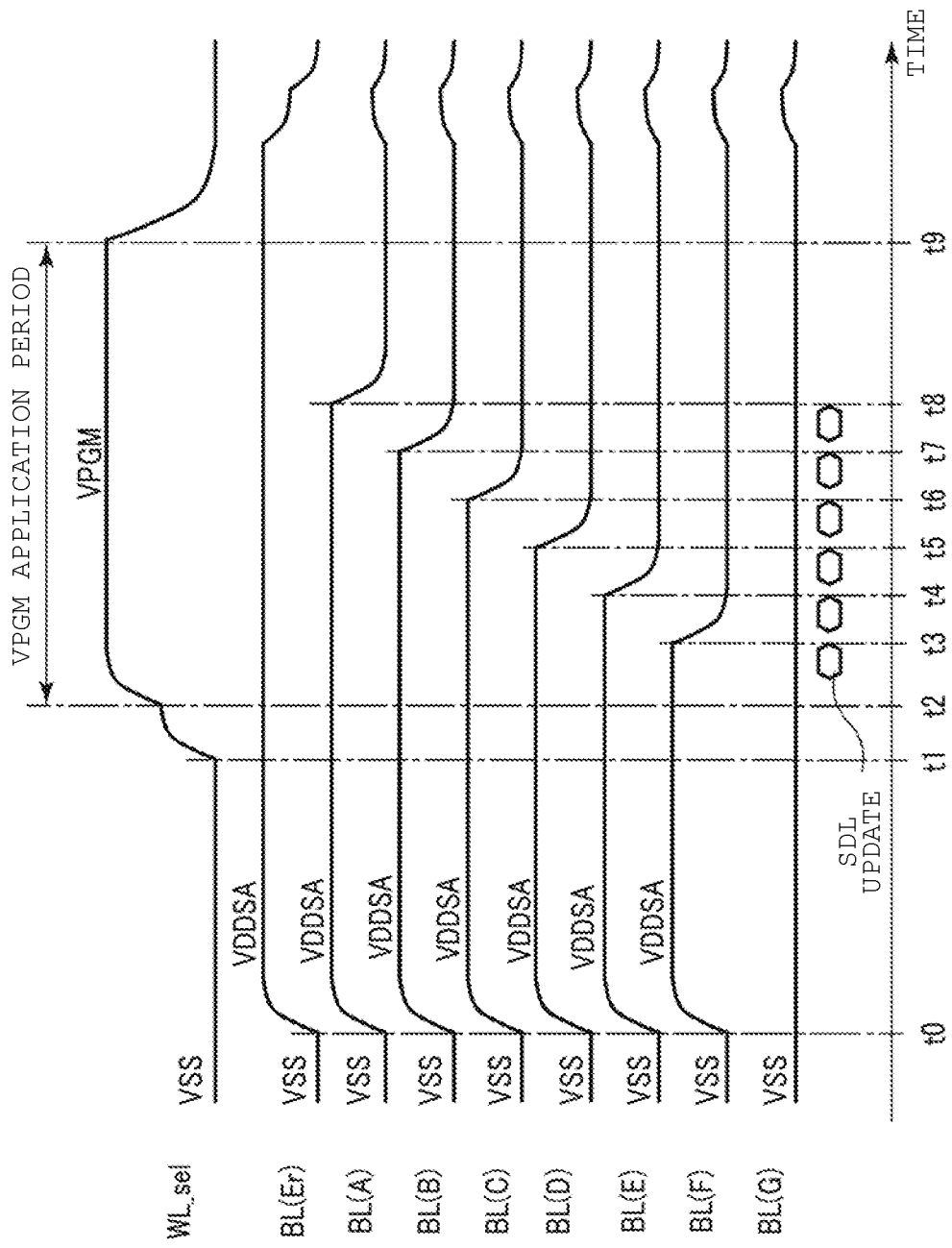
FIG. 22 is a timing diagram illustrating a program operation according to a fourth embodiment.

FIG. 22 is a timing diagram illustrating a program operation according to the fourth embodiment. A bit line charging operation is started. Here, bit lines corresponding to cells to be respectively programmed to be in states "Er" to "G" will be labeled and referred to as BL(Er) to BL(G).

At time t0, the sense amplifier unit 28 applies the ground voltage VSS to the bit line BL (G) corresponding to the highest data state "G." In addition, the sense amplifier unit 28 applies the power source voltage VDDSA to the bit lines BL (Er) to BL (F). Although not illustrated in the drawing, a relation of the voltages of a non-selected word line WL_use1, select gate lines SGD and SGS, a source line SL, and a signal BLC is the same as that described in the first embodiment in FIG. 10.

At time t1, a row decoder 26, similar to that of the first embodiment, applies a voltage VPASS to all the word lines including a selected word line WL. At time t2, the row decoder 26 applies the program voltage VPGM to the selected word line WL. At this time point, first, program of a cell connected to the bit line BL (G) is started.

At time t3, a sequencer 24 updates the data of a latch circuit SDL of the state "F," in other words, overwrites the data of the latch circuit SDL with data "1." Accordingly, the sense amplifier unit 28 applies the ground voltage VSS to the bit line BL(F). At this time point, program of a cell connected to the bit line BL (F) is started.

At time t4, the sequencer 24 rewrites the data of the latch circuit SDL of the state "E" with data "1." Accordingly, the sense amplifier unit 28 applies the ground voltage VSS to the bit line BL(E).

At time t5, the sequencer 24 rewrites the data of the latch circuit SDL of the state "D" with data "1." Accordingly, the sense amplifier unit 28 applies the ground voltage VSS to the bit line BL(D).

At time t6, the sequencer 24 rewrites the data of the latch circuit SDL of the state "C" with data "1." Accordingly, the sense amplifier unit 28 applies the ground voltage VSS to the bit line BL(C).

At time t7, the sequencer 24 rewrites the data of the latch circuit SDL of the state "B" with data "1." Accordingly, the sense amplifier unit 28 applies the ground voltage VSS to the bit line BL(B).

At time t8, the sequencer 24 rewrites the data of the latch circuit SDL of the state "A" with data "1." Accordingly, the sense amplifier unit 28 applies the ground voltage VSS to the bit line BL(A).

At time t9, the row decoder 26 applies the ground voltage VSS to all the word lines WL. A period t2 to t9 is a program voltage VPGM application period ("VPGM application period"). Operations performed thereafter are the same as those according to the first embodiment.

In accordance with such a program operation, in the order of the bit lines BL (A) to BL (G), a period in which the ground voltage VSS for program is applied is shortened. In other words, as a cell has a higher state, a period in which an electric potential difference between the selected word line WL and the channel is large becomes longer. Accordingly, program of the states "A" to "G" can be executed by executing a program voltage VPGM applying operation once. According to a fourth embodiment, a total program time can be shortened.

[5] Fifth Embodiment

A fifth embodiment is an example in which the QPW system is applied to the fourth embodiment, and a voltage for QPW is applied to a bit BL that is a QPW target.

Figure 23:
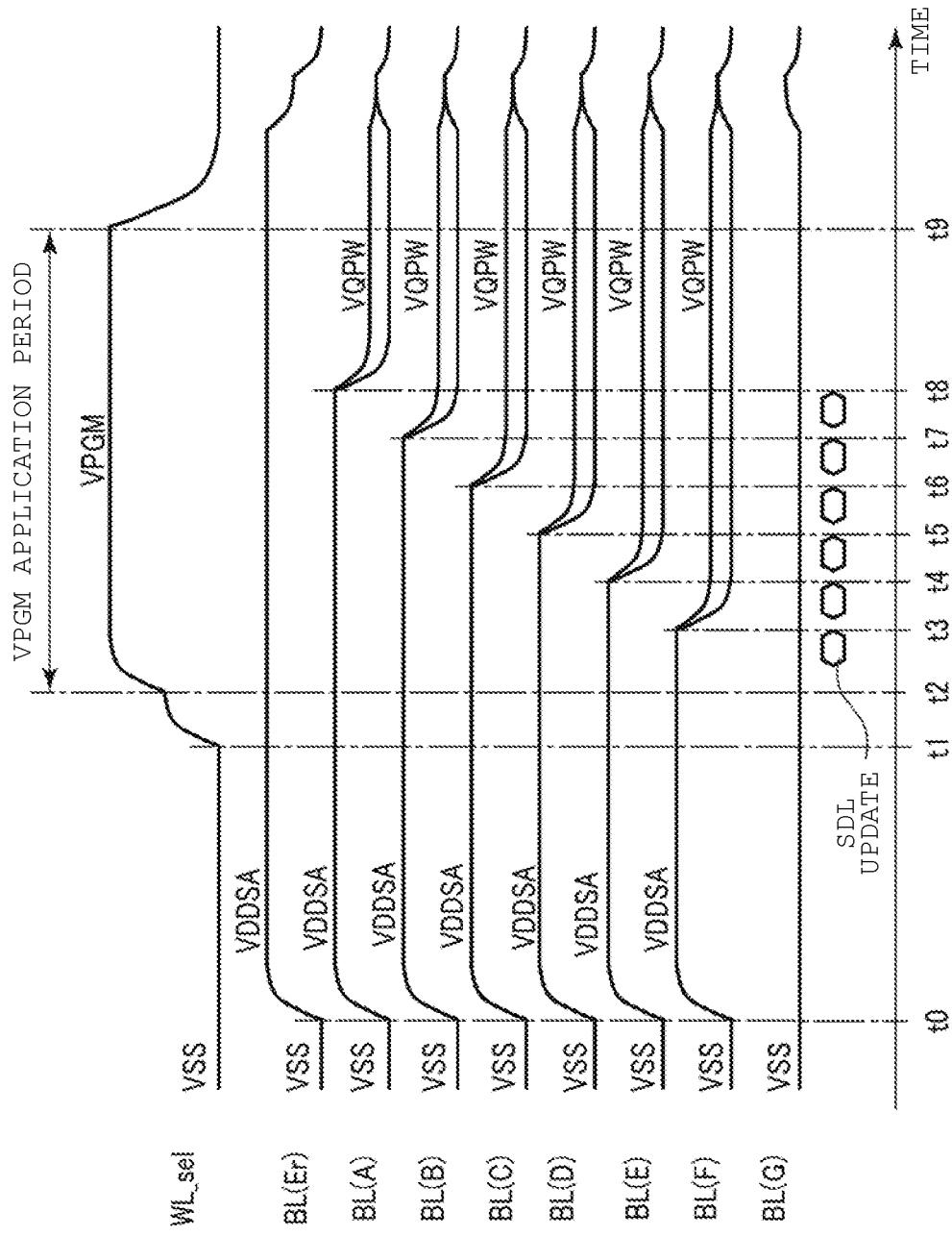
FIG. 23 is a timing diagram illustrating a program operation according to a fifth embodiment.

FIG. 23 is a timing diagram illustrating a program operation according to the fifth embodiment.

At time t3, a sense amplifier unit 28 applies a voltage VQPW for QPW to a bit line BL that is a QPW target among bit lines BL (F). In addition, the sense amplifier unit 28 applies a ground voltage VSS to a bit line BL that is a program target among the bit lines BL (F). A bit line BL that is a program target is a bit line that is connected to a cell of which the threshold voltage is lower than the verify voltage VL illustrated in FIG. 9. A bit line BL that is a QPW target is a bit line that is connected to a cell of which the threshold voltage is the verify voltage VL or more and lower than the verify voltage VH. The voltage VQPW has a relationship of VSS+Vtn<VQPW<VDDSA+Vtn. Here, the voltage Vtn is a threshold voltage of the n-channel MOS transistor 52. In addition, by switching a source power supply of the transistor 50 of the sense amplifier SA to the voltage VQPW, the voltage VQPW can be applied to a bit line BL that is a QPW target.

Subsequently, similar to the bit line BL (F), the voltage VQPW is selectively applied also to the bit lines BL(E) to BL(A).

According to the fifth embodiment, the QPW system can be applied to the fourth embodiment. Accordingly, the width of the threshold distribution can be narrowed.

[6] Sixth Embodiment

A sixth embodiment is an example in which the QPW system is applied to the fourth embodiment, and a timing at which the ground voltage VSS for program is applied is changed in a bit line BL that is a QPW target and a bit line BL that is a program target.

Figure 24:
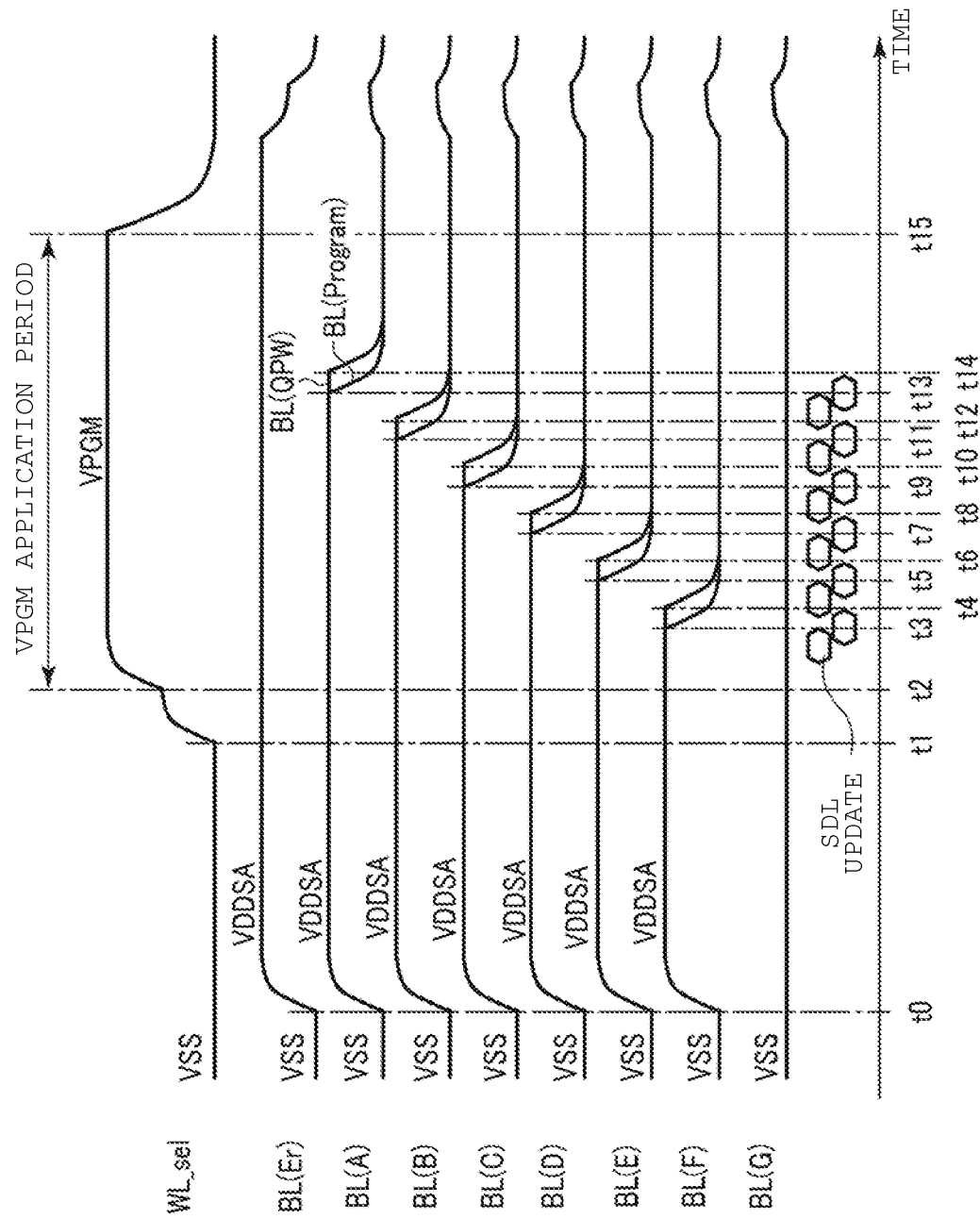
FIG. 24 is a timing diagram illustrating a program operation according to a sixth embodiment.

FIG. 24 is a timing diagram illustrating a program operation according to the sixth embodiment.

At time t3, a sequencer 24 updates a corresponding latch circuit SDL, in other words, rewrites the data of the latch circuit SDL with data "1" for a bit line BL that is a program target among bit lines BL(F). Accordingly, a sense amplifier unit 28 applies the ground voltage VSS to a bit line BL that is a program target.

At time t4, the sequencer 24 updates a corresponding latch circuit SDL, in other words, rewrites the data of the latch circuit SDL with data "1" for a bit line BL that is a QPW target among the bit lines BL(F). Accordingly, the sense amplifier unit 28 applies the ground voltage VSS to the bit line BL that is the QPW target.

Subsequently, also for the bit lines BL(E) to BL(A), similarly to the bit line BL(F), the ground voltage VSS is applied to a bit line BL that is a QPW target after a bit line BL that is a program target.

According to the sixth embodiment, the voltage VQPW for QPW illustrated in the fifth embodiment does not need to be utilized. Accordingly, voltage control can be more easily performed.

[7] Modified Example

In each of the embodiments described above, a case in which one memory cell transistor stores three-bit data was described as an example, however, the present disclosure is not limited thereto. In the first to third embodiments, one memory cell transistor may be configured to be able to store one-bit data (single level cells: SLC), two-bit data (multi-level cells: MLC), or four-bit or more data. In the fourth and fifth embodiments, two-bit data may be storable (MLC), or four-bit or more data may be storable. Also in such examples, the various operations described in the embodiments described above can be similarly achieved.

In description presented here, the term "connection" represents electrical connection, and, for example and does not exclude a case in which another device is interposed between two connected devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell array including a plurality of memory cells;
   a plurality of bit lines, each bit line being connected to one of the memory cells in the plurality of memory cells;
   a word line commonly connected to the plurality of memory cells; and
   a control circuit configured to apply a program voltage to the word line, wherein
   the control circuit is configured to change a voltage applied to a first bit line in the plurality of bit lines within a first period in which the program voltage is being applied to the word line, wherein
   the control circuit is configured to apply a first voltage to the first bit line at a first time within the first period, and apply a second voltage that is lower than the first voltage to the first bit line at a second time that is after the first time and within the first period.

2. The semiconductor memory device according to claim 1, wherein
   a threshold voltage of a first memory cell connected to the first bit line is a first threshold voltage level or higher and lower than a second threshold voltage level that is higher than the first threshold voltage level,
   a threshold voltage of a second memory cell connected to a second bit line in the plurality of bit lines is lower than the first threshold voltage level,
   a threshold voltage of a third memory cell connected to a third bit line in the plurality of bit lines is the second threshold voltage level or higher, and
   the control circuit applies the second voltage to the second bit line and applies the first voltage to the third bit line during the first period.

3. The semiconductor memory device according to claim 2, wherein the control circuit raises a voltage of the third bit line at a third time that is before the first period, and raises a voltage of the first bit line at a fourth time that is after the third time and before the first period.

4. The semiconductor memory device according to claim 2, further comprising:
   a discharge circuit connected to the first bit line, wherein
   the discharge circuit adjusts a current amount discharged from the first bit line when the first bit line transitions from the first voltage to the second voltage.

5. The semiconductor memory device according to claim 1, further comprising:
   a discharge circuit connected to the first bit line, wherein
   the discharge circuit adjusts a current amount discharged from the first bit line when the first bit line transitions from the first voltage to the second voltage.

6. The semiconductor memory device according to claim 1, wherein
   each of the plurality of memory cells is capable of storing data of multiple bits in accordance with a threshold voltage,
   the first bit line is connected to a first memory cell to be programmed to a first threshold voltage, a second bit line in the plurality of bit lines is connected to a second memory cell to be programmed to a second threshold voltage that is higher than the first threshold voltage, and the control circuit is further configured to apply the first voltage to the second bit line at the first time within the first period, apply the second voltage to the second bit line at a third time that is within the first period and after the first time but before the second time.

7. The semiconductor memory device according to claim 6, wherein a third bit line in the plurality of bit lines is connected to a third memory cell to be programmed to the first threshold voltage, and the control circuit applies the first voltage to the third bit line at the first time and applies a third voltage that is lower than the first voltage and higher than the second voltage to the third bit line at the third time.

8. The semiconductor memory device according to claim 6, wherein a third bit line included in the plurality of bit lines is connected to a third memory cell to be programmed to the first threshold voltage, and the control circuit applies the first voltage to the third bit line at the first time and applies the second voltage to the third bit line at a fourth time that is within the first period and after the third time.

9. The semiconductor memory device according to claim 1, wherein the plurality of memory cells are NAND flash memory cells.

10. The semiconductor memory device according to claim 1, wherein the memory cell array comprises three-dimensionally stacked NAND flash memory cells.

11. The semiconductor memory device according to claim 1, wherein the control circuit comprises a sequencer.

12. A flash memory, comprising:
a plurality of memory cells in a memory cell array;
a word line commonly connected to the plurality of memory cells;
a plurality of bit lines, each bit line being connected to one of the memory cells in the plurality of memory cells; and
a control circuit configured to apply a program voltage to the word line and change a voltage applied to a first selected bit line in the plurality of bit lines during a first period in which the program voltage is being applied to the word line, wherein
the control circuit is further configured to apply a first voltage to the first bit line at a first time within the first period, and then apply a second voltage that is lower than the first voltage to the first bit line at a second time that is after the first time and within the first period.

13. The flash memory according to claim 12, wherein the control circuit is further configured to apply a constant voltage to a non-selected bit line in the plurality of bit lines during the first period.

14. The flash memory according to claim 12, wherein the control circuit is further configured to vary a time the voltage is applied to each bit line in the plurality according to an intended program state of a memory cell in the plurality of memory cells to which each bit line is respectively connected.

15. The flash memory according to claim 12, wherein the plurality of memory cells is NAND flash-type memory cells.

16. The flash memory according to claim 12, wherein the memory cell array comprises three-dimensionally stacked NAND flash memory cells.

17. The flash memory according to claim 12, wherein each memory cell in the plurality of memory cells is configured to store multi-bit data according to a threshold voltage value set in the memory cell.

18. A memory device, comprising:
a memory cell array chip including a plurality of memory cells;
a memory controller including:
a host interface through which read and write commands are received from a host apparatus, and
a memory interface through which read and write commands are sent to the memory cell array chip;
the memory cell array chip including:
a plurality of bit lines, each bit line being connected to one of the memory cells in the plurality of memory cells;
a word line commonly connected to the plurality of memory cells; and
a control circuit configured to apply a program voltage to the word line, wherein
the control circuit is configured to change a voltage applied to a first bit line in the plurality of bit lines within a first period in which the program voltage is being applied to the word line according to a write command received from the memory controller, and
the control circuit is further configured to apply a first voltage to the first bit line at a first time within the first period, and then apply a second voltage that is lower than the first voltage to the first bit line at a second time that is after the first time and within the first period.

19. The memory device according to claim 18, wherein each memory cell in the plurality of memory cells is configured to store multi-bit data according to a threshold voltage value set in the memory cell.

20. The memory device according to claim 18, wherein the plurality of memory cells are NAND flash memory cells.

* * * * *